United States Patent
Akimoto

(10) Patent No.: US 12,255,276 B2
(45) Date of Patent: Mar. 18, 2025

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 580 days.

(21) Appl. No.: 17/522,497

(22) Filed: Nov. 9, 2021

(65) Prior Publication Data

US 2022/0069188 A1 Mar. 3, 2022

Related U.S. Application Data

(63) Continuation of application No. PCT/JP2020/018398, filed on May 1, 2020.

(30) Foreign Application Priority Data

May 10, 2019 (JP) .................. 2019-090020

(51) Int. Cl.
*H01L 33/62* (2010.01)
*H01L 33/00* (2010.01)
(Continued)

(52) U.S. Cl.
CPC .......... *H01L 33/62* (2013.01); *H01L 33/0075* (2013.01); *H01L 33/32* (2013.01);
(Continued)

(58) Field of Classification Search
CPC ..... H01L 33/62; H01L 33/0075; H01L 33/32; H01L 33/42; H01L 33/44; H01L 33/50; H01L 33/0093; H01L 25/167
See application file for complete search history.

(56) References Cited

U.S. PATENT DOCUMENTS

2007/0205420 A1 9/2007 Ponjee et al.
2009/0315965 A1 12/2009 Yamagata et al.
(Continued)

FOREIGN PATENT DOCUMENTS

CN 101529605 A 9/2009
CN 108022550 A 5/2018
(Continued)

OTHER PUBLICATIONS

Uang, The use of transparent indium-zinc oxide/(oxidized-Ni/Au) ohmic contact to GaN-based light-emitting diodes for light output improvement, 2006 (Year: 2006).*

*Primary Examiner* — Syed I Gheyas
*Assistant Examiner* — Casey Paul Boatman
(74) *Attorney, Agent, or Firm* — Foley & Lardner LLP

(57) ABSTRACT

A method for manufacturing an image display device includes: providing a semiconductor growth substrate comprising a semiconductor layer on a first substrate, the semiconductor layer comprising a light-emitting layer; providing a second substrate comprising a circuit, wherein the circuit comprises a circuit element; forming a light-shielding layer on the second substrate; forming an insulating film on the light-shielding layer; bonding the semiconductor layer to the second substrate on which the insulating film is formed; forming a light-emitting element by etching the semiconductor layer; forming an insulating layer that covers the light-emitting element; and electrically connecting the light-emitting element to the circuit element. The light-shielding layer is located between the light-emitting element and the circuit element. In a plan view, the light-shielding layer covers the circuit element.

10 Claims, 24 Drawing Sheets

(51) Int. Cl.
*H01L 33/32* (2010.01)
*H01L 33/42* (2010.01)
*H01L 33/44* (2010.01)
*H01L 33/50* (2010.01)

(52) U.S. Cl.
CPC .............. *H01L 33/42* (2013.01); *H01L 33/44* (2013.01); *H01L 33/50* (2013.01); *H01L 33/0093* (2020.05); *H01L 2933/0025* (2013.01); *H01L 2933/0041* (2013.01); *H01L 2933/0066* (2013.01)

(56) References Cited

U.S. PATENT DOCUMENTS

| | | | |
|---|---|---|---|
| 2010/0026779 A1 * | 2/2010 | Yonehara | B41J 2/45 438/34 |
| 2014/0367633 A1 | 12/2014 | Bibl et al. | |
| 2014/0367705 A1 | 12/2014 | Bibl et al. | |
| 2018/0006058 A1 | 1/2018 | Lee | |
| 2018/0012951 A1 | 1/2018 | Sato | |
| 2018/0122298 A1 | 5/2018 | Lee et al. | |
| 2018/0122837 A1 | 5/2018 | Kang et al. | |
| 2018/0175268 A1 | 6/2018 | Moon et al. | |
| 2018/0219123 A1 | 8/2018 | Wang et al. | |
| 2019/0131343 A1 | 5/2019 | Templier et al. | |
| 2019/0157512 A1 | 5/2019 | Jung et al. | |
| 2019/0229235 A1 | 7/2019 | Iguchi | |
| 2019/0267357 A1 | 8/2019 | Iguchi et al. | |

FOREIGN PATENT DOCUMENTS

| | | | |
|---|---|---|---|
| CN | 108615740 A | | 10/2018 |
| JP | 2002-057283 A | | 2/2002 |
| JP | 2002-141492 A | | 5/2002 |
| JP | 2007-531261 A | | 11/2007 |
| JP | 2008-147608 A | | 6/2008 |
| JP | 2013037139 A | * | 2/2013 |
| JP | 2016-522585 A | | 7/2016 |
| JP | 2016-139560 A | | 8/2016 |
| JP | 2016-523450 A | | 8/2016 |
| JP | 2018-101785 A | | 6/2018 |
| JP | 2019-129226 A | | 8/2019 |
| JP | 2019-522894 A | | 8/2019 |
| WO | WO-2018/132070 A1 | | 7/2018 |

* cited by examiner

METHOD FOR MANUFACTURING IMAGE DISPLAY DEVICE AND IMAGE DISPLAY DEVICE

CROSS-REFERENCE TO RELATED APPLICATIONS

The present application is a bypass continuation of PCT Application No. PCT/JP2020/018398, filed May 1, 2020, which claims priority to Japanese Application No. 2019-090020, filed May 10, 2019. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full HD, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a decrease of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (see, e.g., Japanese Patent Publication No. 2002-141492).

SUMMARY

One embodiment of the invention provides an image display device and a method for manufacturing an image display device in which a transfer process of a light-emitting element is shortened, and the yield is increased.

Solution to Problem

A method for manufacturing an image display device according to one embodiment of the invention includes a process of preparing a substrate including a semiconductor layer including a light-emitting layer on a first substrate, a process of preparing a second substrate in which a circuit that includes a circuit element is formed, a process of forming a light-shielding layer on the second substrate, a process of forming an insulating film on the light-shielding layer, a process of bonding the semiconductor layer to the second substrate on which the insulating film is formed, a process of forming a light-emitting element by etching the semiconductor layer, a process of forming an insulating layer that covers the light-emitting element, and a process of electrically connecting the light-emitting element to the circuit element. The light-shielding layer is located between the light-emitting element and the circuit element. The light-shielding layer is provided to cover the circuit element when viewed in plan.

An image display device according to one embodiment of the invention includes: a circuit element; a first wiring layer electrically connected to the circuit element; a first insulating film covering the circuit element and the first wiring layer; a light-emitting element located on the first insulating film; a light-shielding layer located in the first insulating film between the circuit element and the light-emitting element; a second insulating film covering at least a portion of the light-emitting element, and a second wiring layer located on the second insulating film and electrically connected to the light-emitting element. The light-emitting element includes a first semiconductor layer of a first conductivity type, a light-emitting layer located on the first semiconductor layer, and a second semiconductor layer located on the light-emitting layer, wherein the second semiconductor layer is of a second conductivity type that is different from the first conductivity type. The light-shielding layer is provided to cover the circuit element when viewed in plan.

An image display device according to one embodiment of the invention includes: multiple transistors; a first wiring layer electrically connected to the multiple transistors; a first insulating film covering the multiple transistors and the first wiring layer; a first semiconductor layer that is located on the first insulating film and is of a first conductivity type; a light-emitting layer located on the first semiconductor layer; a second semiconductor layer that is located on the light-emitting layer and is of a second conductivity type that is different from the first conductivity type; a light-shielding layer located in the first insulating film and located between the first semiconductor layer and the multiple transistors; a second insulating film covering the first insulating film and covering at least a portion of the second semiconductor layer; a second wiring layer connected to a transparent electrode located on multiple exposed surfaces of the second semiconductor layer, wherein the multiple exposed surfaces are exposed from the second insulating film respectively to correspond to the multiple transistors, and a via that extends through the first and second insulating films and electrically connects wiring portion of the first wiring layer and wiring portion of the second wiring layer. The light-shielding layer is located between the light-emitting element and the multiple transistors. The light-shielding layer is provided to cover the circuit element when viewed in plan.

According to one embodiment of the invention, an image display device and a method for manufacturing an image display device are realized in which a transfer process of a light-emitting element is shortened, and the yield is increased.

DETAILED DESCRIPTION

Figure 1:
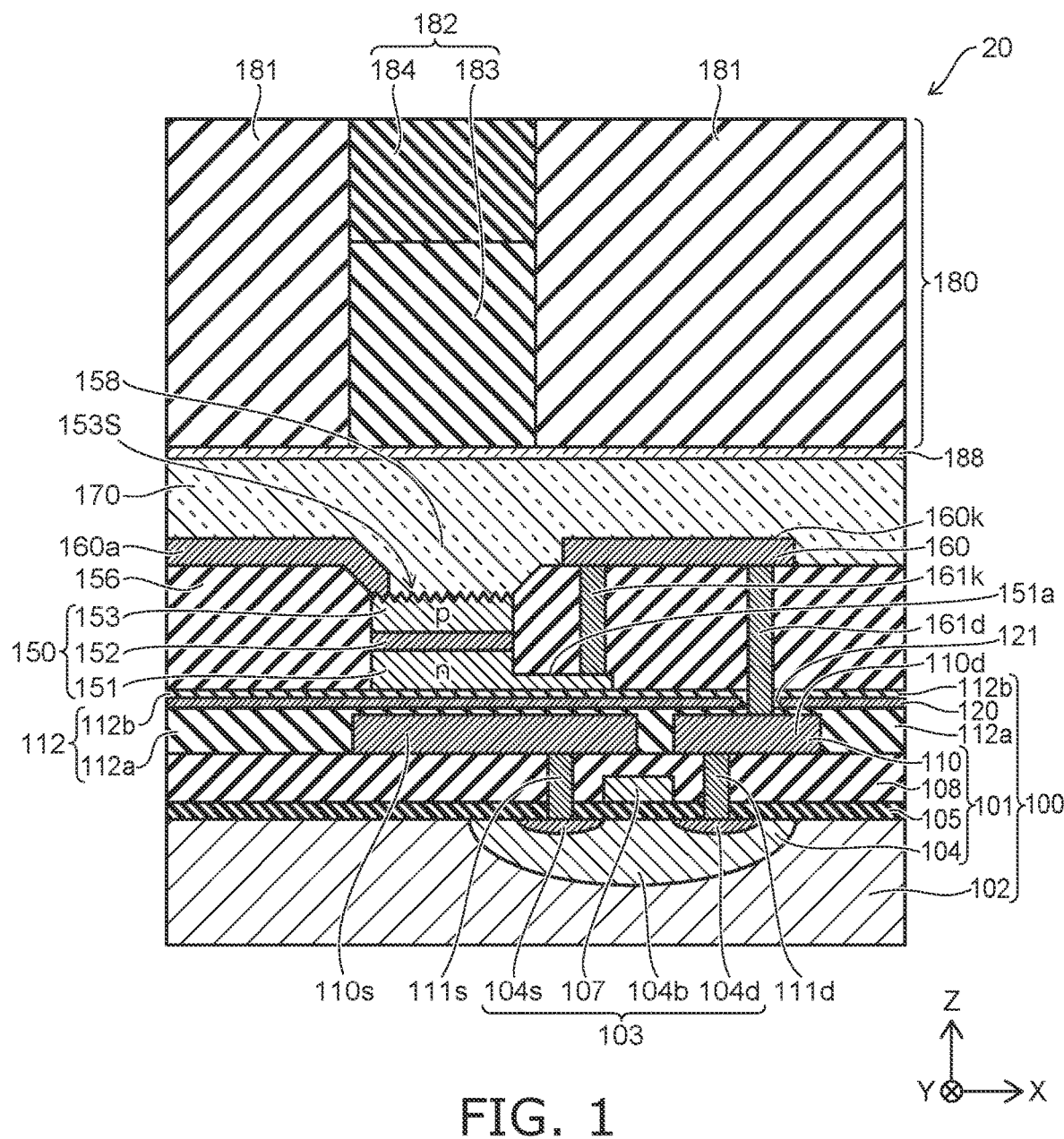
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to an embodiment.

The configuration of a subpixel 20 of the image display device of the embodiment is schematically shown in FIG. 1. A pixel 10 that is included in an image displayed in the image display device includes multiple subpixels 20.

Hereinbelow, the description may use an XYZ three-dimensional coordinate system. The subpixels 20 are arranged on a two-dimensional plane. The two-dimensional plane in which the subpixels 20 are arranged is taken as an XY plane. The subpixels 20 are arranged along an X-axis direction and a Y-axis direction.

The subpixel 20 includes a light-emitting surface 153S that is substantially parallel to the XY plane. The light-emitting surface 153S outputs light mainly toward a positive direction of a Z-axis orthogonal to the XY plane.

FIG. 1 schematically shows a cross section when the subpixel 20 is cut by a plane parallel to the XZ plane.

As shown in FIG. 1, the subpixel 20 of the image display device includes a transistor 103, a first wiring layer (a first wiring layer) 110, a first inter-layer insulating film (a first insulating film) 112, a light-shielding layer 120, a light-emitting element 150, a second inter-layer insulating film (a second insulating film) 156, a second wiring layer (a second wiring layer) 160, and a via 161d. The subpixel 20 further includes a color filter 180. The color filter (the wavelength conversion member) 180 is located on a surface resin layer 170 with a transparent thin film adhesive layer 188 interposed. The surface resin layer 170 is located on the light-emitting element 150, the inter-layer insulating film 156, and the wiring layer 160.

The transistor 103 is formed in a substrate 102. Other than the transistor 103, other circuit elements such as the transistors, resistances, capacitors, etc., are formed in the substrate 102, and a circuit 101 is configured using wiring portions, etc. For example, the transistor 103 corresponds to a drive transistor 26 shown in FIG. 3 described below; also, a select transistor 24, a capacitor 28, etc., are circuit elements. Hereinbelow, the circuit 101 includes an element formation region 104 in which the circuit elements are formed, an insulating layer 105, the wiring layer 110, vias that connect the wiring layer 110 and the circuit elements, and an insulating film 108 that insulates between the circuit elements and the like.

The substrate 102, the circuit 101, the inter-layer insulating film 112, and other components may be inclusively called a circuit board 100. Also, as elaborated below, the light-shielding layer 120 is located in the inter-layer insulating film 112, and the circuit board 100 includes the light-shielding layer 120.

The transistor 103 includes a p-type semiconductor region 104b, n-type semiconductor regions 104s and 104d, and a gate 107. The gate 107 is located on the p-type semiconductor region 104b with the insulating layer 105 interposed. The insulating layer 105 is provided to insulate the element formation region 104 and the gate 107 and to sufficiently insulate between the other adjacent circuit elements. A channel may be formed in the p-type semiconductor region 104b when a voltage is applied to the gate 107. The transistor 103 is an n-channel transistor, e.g., an n-channel MOSFET.

The element formation region 104 is located in the substrate 102. The substrate 102 is, for example, a Si substrate. The element formation region 104 includes the p-type semiconductor region 104b and the n-type semiconductor regions 104s and 104d. The p-type semiconductor region 104b is located at the surface vicinity of the substrate 102. The n-type semiconductor regions 104s and 104d are located in the p-type semiconductor region 104b and are separated from each other at the surface vicinity of the p-type semiconductor region 104b.

The insulating layer 105 is located at the surface of the substrate 102. The insulating layer 105 also covers the element formation region 104, and covers the surfaces of the p-type semiconductor region 104b and the n-type semiconductor regions 104s and 104d. The insulating layer 105 is, for example, $SiO_2$. The insulating layer 105 may be a multilevel insulating layer that includes $SiO_2$, $Si_3N_4$, etc., according to the covered region. The insulating layer 105 may include a layer of an insulating material that has a high dielectric constant.

The gate 107 is located on the p-type semiconductor region 104b with the insulating layer 105 interposed. The gate 107 is located between the n-type semiconductor regions 104s and 104d. The gate 107 is, for example, polycrystalline Si. The gate 107 may include a silicide or the like that has a lower resistance than polycrystalline Si.

In the example, the gate 107 and the insulating layer 105 are covered with the insulating film 108. The insulating film 108 is, for example, $SiO_2$, $Si_3N_4$, etc. To planarize the surface when forming the wiring layer 110, an organic insulating film such as PSG (Phosphorus Silicon Glass), BPSG (Boron Phosphorus Silicon Glass), etc., also may be provided.

Vias 111s and 111d are formed in the insulating film 108. The first wiring layer 110 is formed on the insulating film 108. The first wiring layer 110 includes multiple wiring portions that may have different potentials, and includes wiring portions 110s and 110d. Thus, in FIG. 1 and subsequent cross-sectional views, the reference numeral of each wiring layer is displayed at a position beside one wiring portion included in the wiring layer.

The vias 111s and 111d are located respectively between the n-type semiconductor regions 104s and 104d and the wiring portions 110s and 110d of the wiring layer 110 and electrically connect these components. For example, the wiring layer 110 and the vias 111s and 111d are formed of a metal such as Al, Cu, etc. The wiring layer 110 and the vias 111s and 111d may include a refractory metal, etc.

The first inter-layer insulating film 112 is located on the insulating film 108 and the wiring layer 110. The first inter-layer insulating film 112 also functions as a protective film at the circuit board 100 that protects the surface of the circuit board 100.

The first inter-layer insulating film 112 includes multiple insulating layers. The multiple insulating layers are a first insulating layer 112a and a second insulating layer 112b. The first insulating layer 112a covers the insulating film 108 and the first wiring layer 110. The light-shielding layer 120 is located on the first insulating layer 112a. The second insulating layer 112b is located on the light-shielding layer 120. The light-shielding layer 120 is located between the first insulating layer 112a and the second insulating layer 112b.

The first insulating layer 112a and the second insulating layer 112b may be formed of the same material or may be formed of different materials. For example, the first insulating layer 112a may be formed of PSG, BPSG, or the like, and the second insulating layer 112b may be formed of SOG (Spin On Glass) or the like. When the light-shielding layer 120 is conductive, the second insulating layer 112b insulates the light-shielding layer 120 and the light-emitting element 150 that is located on the light-shielding layer 120. The second insulating layer 112b includes a surface that is planarized for wafer bonding.

The light-shielding layer 120 that is a layer that is light-shielding includes a plane that is substantially parallel to the XY plane. The light-shielding layer 120 is provided to cover the entire transistor 103 and the circuit elements that malfunction, etc., due to the irradiation of light. In the example, the light-shielding layer 120 covers at least the entire transistor 103 that drives the light-emitting element 150. It is favorable for the light-shielding layer 120 to cover the entire subpixel 20, and more favorable to cover the entire circuit board 100.

The light-shielding layer 120 prevents the scattered light emitted from the light-emitting element 150 from reaching the circuit elements such as the transistor 103 and the like that are located below the light-shielding layer 120, and prevents malfunction, etc., of the circuit elements. It is favorable for the light-shielding layer 120 to be light-reflective. By setting the light-shielding layer 120 to be light-reflective, the luminous efficiency of the light-emitting element 150 can be increased by the light that is scattered downward from the light-emitting element 150 being reflected upward toward the light-emitting surface side.

The light-shielding layer 120 is formed of a material that shields the scattered light emitted from the light-emitting element 150. For example, the light-shielding layer 120 can be light-reflective by including a metal material such as Al, Ag, etc.

Figure 3:
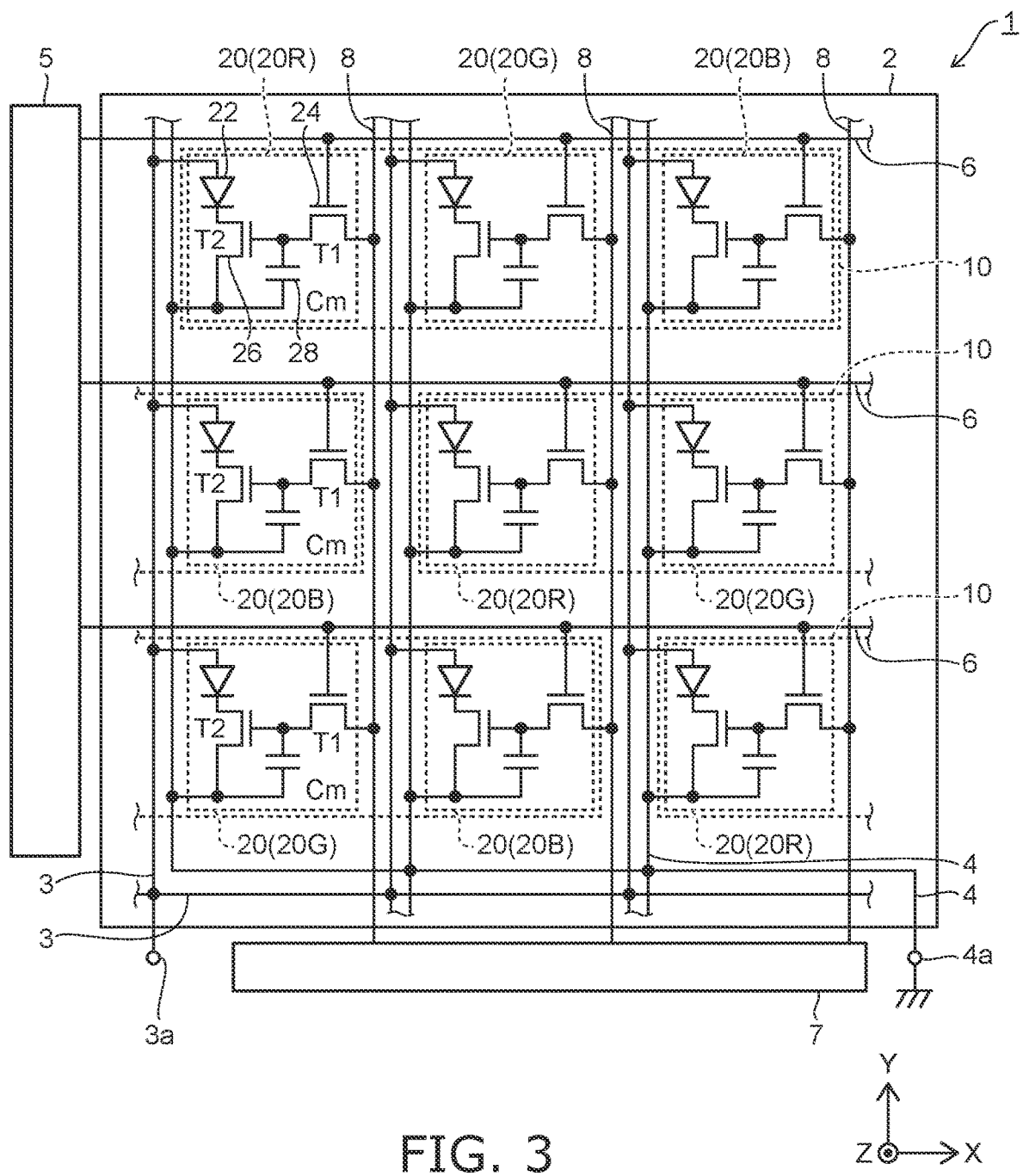
FIG. 3 is a schematic block diagram illustrating the image display device of the first embodiment.

When the light-shielding layer 120 is a conductive material such as a metal, etc., the light-shielding layer 120 may not be connected to some potential, or may be connected to some appropriate potential. For example, in the example, the light-shielding layer 120 may be connected to the potential of a GND line 4 (FIG. 3), or may be connected to the potential of a power supply line 3 (FIG. 3). In such a case, the light-shielding layer 120 also can be utilized as a supplemental wiring portion of the GND line 4 or the power supply line 3.

The voltage value with respect to the GND line that is the reference potential is not limited to that described above, and an appropriate value can be arbitrarily set. The light-shielding layer 120 can be located over all of the subpixels 20; therefore, the effect of suppressing electromagnetic radiation due to the operation of the circuit elements can be provided by applying a voltage that has a constant potential with respect to the reference potential to the light-shielding layer 120.

The light-shielding layer 120 includes a through-hole 121. The through-hole 121 is located at a position that corresponds to the wiring portion 110d when projected onto the XY plane. The via 161d is inserted into the through-hole 121. The material of the second insulating layer 112b is filled between the through-hole 121 and the via 161d, and the via 161d and the light-shielding layer 120 are electrically insulated.

The light-emitting element 150 includes an n-type semiconductor layer (a first semiconductor layer) 151, a light-emitting layer 152, and a p-type semiconductor layer (a second semiconductor layer) 153. The n-type semiconductor layer 151, the light-emitting layer 152, and the p-type semiconductor layer 153 are stacked in this order from the inter-layer insulating film 112 of the circuit board 100 in the positive direction of the Z-axis, that is, toward the light-emitting surface 153S. That is, in the example, the n-type semiconductor layer 151 of the light-emitting element 150 is located on the second insulating layer 112b of the inter-layer insulating film 112.

Although the light-emitting element 150 has, for example, a substantially square or rectangular shape when projected onto the XY plane, the corners may be rounded. The light-emitting element 150 may have, for example, an elliptical shape or a circular shape when projected onto the XY plane. By appropriately selecting the shape, arrangement, and the like of the light-emitting element when viewed in plan, the degree of freedom of the layout is increased. In the example, the n-type semiconductor layer 151 includes a step portion 151a that extends in the X-axis direction on the second insulating layer 112b.

It is favorable for the light-emitting element 150 to include, for example, a nitride semiconductor such as $In_xAl_yGa_{1-x-y}N$ ($0 \leq X$, $0 \leq Y$, and $X+Y<1$), etc. The light-emitting element 150 according to one embodiment of the invention is a so-called blue light-emitting diode, and the wavelength of the light emitted by the light-emitting element 150 is, for example, about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above, and can be set to an appropriate value.

The second inter-layer insulating film 156 covers the first inter-layer insulating film 112 and the light-emitting element 150. It is favorable for the second inter-layer insulating film 156 to be formed of a white resin. For example, a white resin can be realized by dispersing, in an organic material, scattering particles of titanium oxide or the like that are made to be fine to have an appropriate particle size. By setting the inter-layer insulating film 156 to be a white resin, the light that is emitted by the light-emitting element 150 in the lateral direction and/or the downward direction can be reflected, and the luminance of the light-emitting element 150 can be substantially increased.

The second inter-layer insulating film 156 may be a black resin. By setting the inter-layer insulating film 156 to be a black resin, the scattering of the light in the subpixel is suppressed, and stray light is more effectively suppressed. An image display device in which stray light is suppressed can display a sharper image.

The inter-layer insulating film 156 has a function of protecting the light-emitting element 150, and a function of planarizing the surface for the wiring layer 160 that is formed on the second inter-layer insulating film 156.

The second inter-layer insulating film 156 includes an opening 158. The opening 158 is formed by removing a portion of the inter-layer insulating film 156 above the light-emitting element 150. The opening 158 is formed so that the light-emitting surface 153S is exposed from under the inter-layer insulating film 156. The light-emitting surface 153S is the surface of the p-type semiconductor layer 153 that is opposite to the surface contacting the light-emitting layer 152. It is favorable to perform surface roughening of the light-emitting surface 153S. The light extraction efficiency of the light-emitting element 150 can be increased when the light-emitting surface 153S is a rough surface.

A via 161k is provided to extend through the second inter-layer insulating film 156. One end of the via 161k is connected to the step portion 151a.

The via 161d is provided to extend through the inter-layer insulating films 112 and 156 and the light-shielding layer 120. As described above, the via 161d is insulated from the light-shielding layer 120 by the inter-layer insulating film 112, and one end of the via 161d is connected to the wiring portion 110d.

The wiring layer 160 is located on the planarized inter-layer insulating film 156. The wiring layer 160 includes wiring portions 160a and 160k. The wiring portion 160a is formed to extend to the opening 158, and the tip of the wiring portion 160a is connected to the light-emitting surface 153S. Although not shown in this drawing, the wiring portion 160a is connected to a power supply line that supplies a power supply to the subpixel 20.

The wiring portion 160k is connected to the other ends of the vias 161k and 161d. Accordingly, the n-type semiconductor layer 151 of the light-emitting element 150 is electrically connected to a main electrode of the transistor 103 by the vias 161k and 161d and the wiring portions 160k and 110d.

Thus, the p-type semiconductor layer 153 of the light-emitting element 150 is connected to the power supply line via the wiring portion 160a. The n-type semiconductor layer 151 of the light-emitting element 150 is connected to a drain electrode of the transistor 103 by the via 161k, the wiring portion 160k, the via 161d, and the wiring portion 110d.

The surface resin layer 170 covers the second inter-layer insulating film 156 and the second wiring layer 160. The surface resin layer 170 is a transparent resin, protects the inter-layer insulating film 156 and the wiring layer 160, and includes a planarized surface for bonding the color filter 180.

The color filter 180 includes a light-shielding part 181 and a color conversion part 182. The color conversion part 182 is located directly above the light-emitting surface 153S of the light-emitting element 150 to correspond to the shape of the light-emitting surface 153S. In the color filter 180, the part other than the color conversion part 182 is the light-shielding part 181. The light-shielding part 181 is a so-called black matrix that decreases blur due to color mixing of the light emitted from adjacent color conversion parts 182, etc., and makes it possible to display a sharp image.

The color conversion part 182 is one layer or two layers. A two-layer part is shown in FIG. 1. Whether the color conversion part 182 is one layer or two layers is determined by the color, i.e., the wavelength, of the light emitted by the subpixel 20. When the light emission color of the subpixel 20 is red or green, it is favorable for the color conversion part 182 to be two layers. When the light emission color of the subpixel 20 is blue, it is favorable to be one layer.

When the color conversion part 182 is two layers, the first layer that is more proximate to the light-emitting element 150 is a color conversion layer 183, and the second layer is a filter layer 184. That is, the filter layer 184 is stacked on the color conversion layer 183.

The color conversion layer 183 is a layer that converts the wavelength of the light emitted by the light-emitting element 150 into the desired wavelength. When the subpixel 20 emits red, light of the wavelength of the light-emitting element 150, i.e., 467 nm±20 nm, is converted into, for example, light of a wavelength of about 630 nm±20 nm. When the subpixel 20 emits green, light of the wavelength of the light-emitting element 150, i.e., 467 nm±20 nm, is converted into, for example, light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without the light having passed through the color conversion layer 183. When the wavelength of the light emitted by the light-emitting element 150 is about 467 nm±20 nm, the subpixel 20 may output the light without the light having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 in the blue subpixel 20, a micro external light reflection that occurs in the surface of the light-emitting element 150 is suppressed.

(Modification)

Modifications of the configuration of the subpixel will now be described.

Figure 2A:
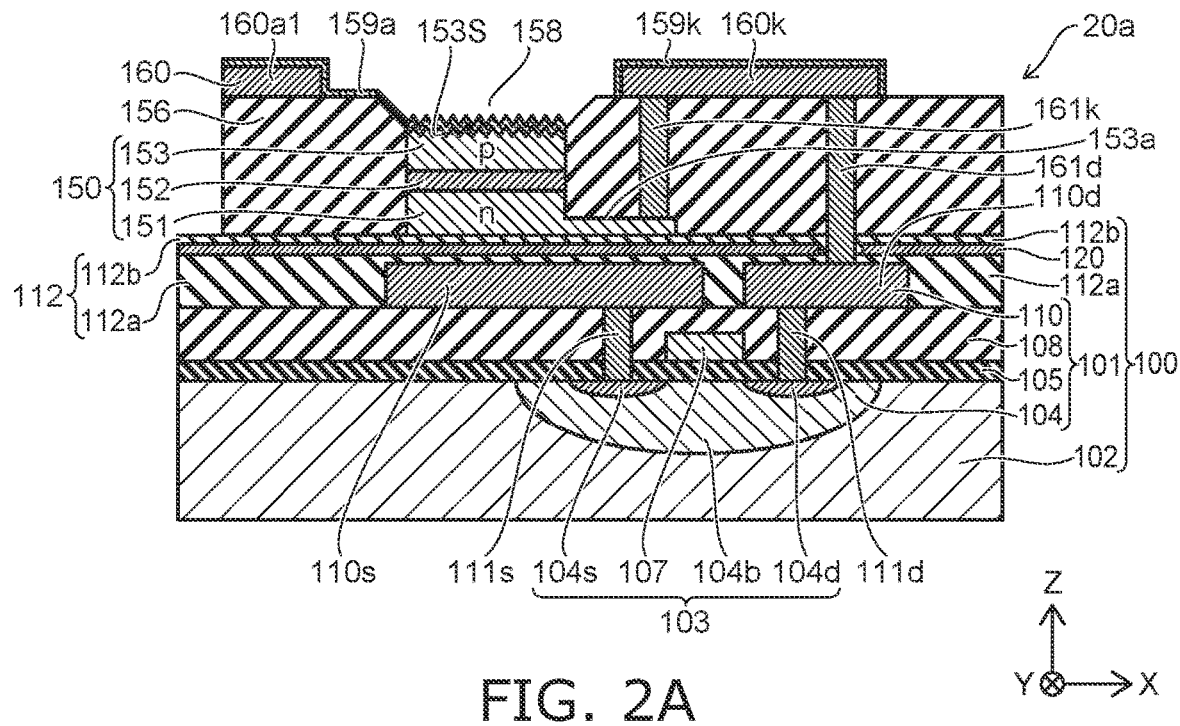
FIG. 2A is a schematic cross-sectional view illustrating a portion of one modification of the image display device of the first embodiment.
Figure 2B:
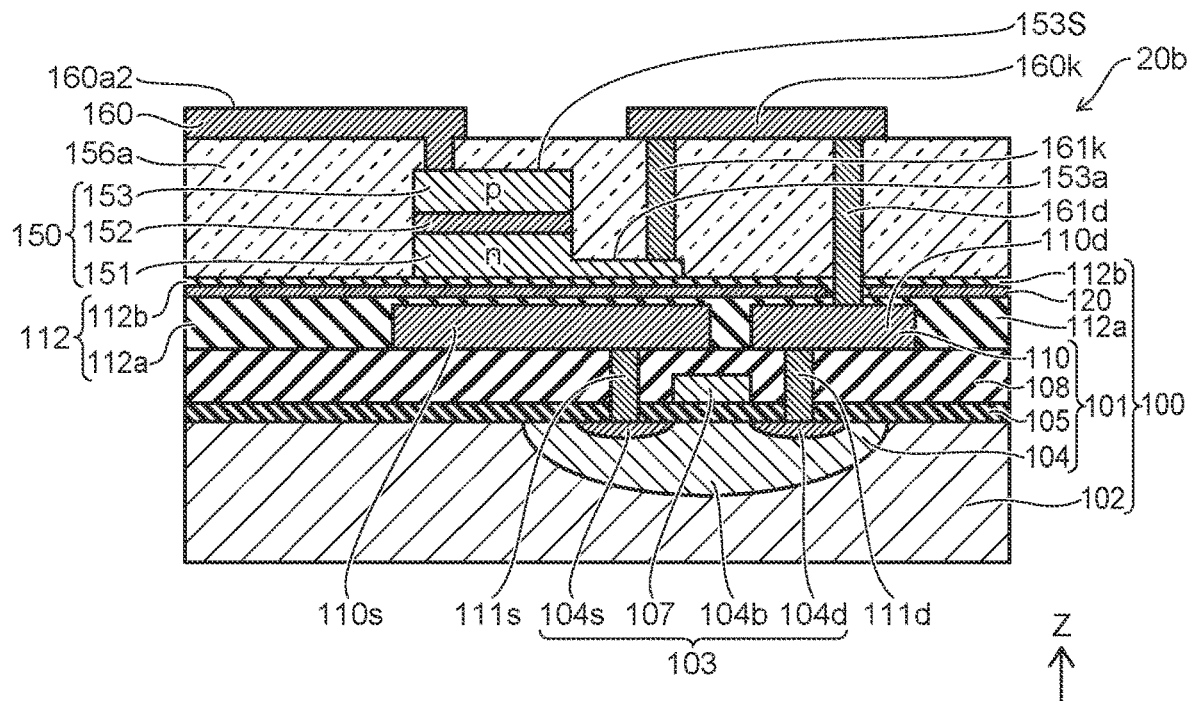
FIG. 2B is a schematic cross-sectional view illustrating a portion of one modification of the image display device of the first embodiment.

FIGS. 2A and 2B are schematic cross-sectional views respectively illustrating portions of the modifications of the image display device of the embodiment.

In FIG. 2A and subsequent cross-sectional views of the subpixel, the surface resin layer 170 and the color filter 180 are not illustrated to avoid complexity. Unless specified otherwise, the surface resin layer and the color filter are located on the second inter-layer insulating film and the second wiring layer. This is similar for other embodiments and their modifications described below as well.

In a subpixel 20a of a modification 1 in FIG. 2A, the connection between the light-emitting element 150 and a wiring portion 160a1 is different from that of the first embodiment. In a subpixel 20b of a modification 2 in FIG. 2B, the configuration of an inter-layer insulating film 156a is different from that of the first embodiment, and the connection method between the light-emitting element 150 and a wiring portion 160a2 is different. In either example, the other components are the same as those of the first embodiment described above; the same components are marked with the same reference numerals, and a detailed description is omitted as appropriate.

As shown in FIG. 2A, the subpixel 20a includes the wiring portion 160a1, the wiring portion 160k, a transparent electrode 159a, and a transparent electrode 159k. Similarly to the first embodiment, it is favorable for the light-emitting surface 153S of the light-emitting element 150 to be roughened.

The wiring portion 160a1 is connected to the power supply line 3 shown in FIG. 3 described below. The transparent electrode 159a is located on the wiring portion 160a1. The transparent electrode 159a is located over the entire light-emitting surface 153S. The transparent electrode 159a is located between the wiring portion 160a1 and the light-emitting surface 153S, and the transparent electrode 159a electrically connects the wiring portion 160a1 and the light-emitting surface 153S. The transparent electrode 159k is located on the wiring portion 160k.

In the subpixel 20a of the modification, by providing the transparent electrode 159a on the light-emitting surface 153S, the connection area with the p-type semiconductor layer 153 can be increased, and the luminous efficiency can be increased. When the light-emitting surface 153S is surface-roughened, the connection area between the light-emitting surface 153S and the transparent electrode 159a can be increased, and the contact resistance can be reduced.

In the subpixel 20b as shown in FIG. 2B, the second inter-layer insulating film 156a is a transparent resin. The light-emitting element 150 emits light from the light-emitting surface 153S via the transparent inter-layer insulating film 156a. The light-emitting surface 153S is connected to the wiring portion 160a2 of the second wiring layer 160 via a contact hole.

In the subpixel 20b of the modification, the light-emitting element 150 emits light from the light-emitting surface 153S via the inter-layer insulating film 156a; therefore, the process of forming an opening in the inter-layer insulating film 156a and the process of roughening the light-emitting surface 153S can be omitted.

The embodiment can include any of the configurations of the subpixels 20, 20a, and 20b shown in the description above.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice configuration. For example, n subpixels 20 are arranged along the X-axis, and m subpixels 20 are arranged along the Y-axis.

The pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of subpixels 20R, 20G, and 20B emitting the desired luminances.

One pixel 10 includes the three subpixels 20R, 20G, and 20B; for example, the subpixels 20R, 20G, and 20B are arranged in a straight line along the X-axis as in the example. In the pixels 10, subpixels of the same color may be arranged in the same column, or subpixels of different colors by column may be arranged as in the example.

The image display device 1 further includes a power supply line 3 and a ground line 4. The power supply line 3 and the ground line 4 are wired in a lattice configuration along the arrangement of the subpixels 20. The power supply line 3 and the ground line 4 are electrically connected to each subpixel 20, and electrical power is supplied to each subpixel 20 from a direct current power supply connected between a power supply terminal 3a and a GND terminal 4a. The power supply terminal 3a and the GND terminal 4a are provided respectively at end portions of the power supply line 3 and the ground line 4, and are connected to a direct current power supply circuit located outside the display region 2. A positive voltage when referenced to the GND terminal 4a is supplied to the power supply terminal 3a.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the outer edge of the display region 2. The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 3, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel MOSFET, and a cathode electrode that is an n-electrode of the light-emitting element 22 is connected to a drain electrode that is a main electrode of the drive transistor 26. The series circuit of the light-emitting element 22 and the drive transistor 26 is connected between the power supply line 3 and the ground line 4. The drive transistor 26 corresponds to the transistor 103 of FIG. 1, etc., and the light-emitting element 22 corresponds to the light-emitting element 150 of FIG. 1, etc. The current that flows in the light-emitting element 22 is determined by the voltage that is applied between the gate and source of the drive transistor 26, and the light-emitting element 22 emits light of a luminance corresponding to the current that flows.

The select transistor 24 is connected between the signal line 8 and the gate electrode of the drive transistor 26 via a main electrode. The gate electrode of the select transistor 24 is connected to the scanning line 6. The capacitor 28 is connected between the ground line 4 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gates and sources of the drive transistors 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current flowing in the light-emitting element 22.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

A method for manufacturing the image display device 1 of the embodiment will now be described.

FIGS. 4A to 7B are schematic cross-sectional views illustrating the method for manufacturing the image display device of the embodiment.

Figure 4A:
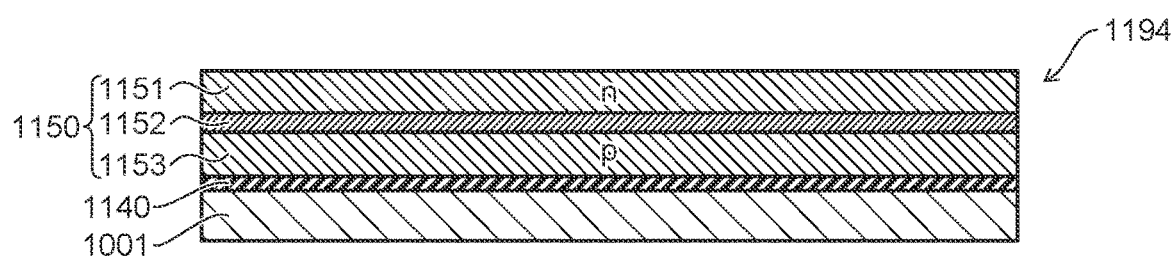
FIG. 4A is a schematic cross-sectional view illustrating a method for manufacturing the image display device of the first embodiment.

A semiconductor growth substrate 1194 is prepared as shown in FIG. 4A. The semiconductor growth substrate 1194 includes a semiconductor layer 1150 that is grown on a crystal growth substrate (a first substrate) 1001. The crystal growth substrate 1001 is, for example, a Si substrate, a sapphire substrate, etc. It is favorable to use a Si substrate.

In the example, a buffer layer 1140 is formed at one surface of the crystal growth substrate 1001. It is favorable for the buffer layer 1140 to include a nitride such as AlN, etc. The buffer layer 1140 is used to relax the mismatch at the interface between the GaN crystal and the crystal growth substrate 1001 when epitaxially growing GaN.

In the semiconductor growth substrate 1194, a p-type semiconductor layer 1153, a light-emitting layer 1152, and an n-type semiconductor layer 1151 are stacked on the buffer layer 1140 in this order from the buffer layer 1140 side. For example, vapor deposition (Chemical Vapor Deposition, CVD) is used to grow the semiconductor layer 1150, and it is favorable to use metal-organic chemical vapor deposition (Metal Organic Chemical Vapor Deposition, MOCVD). The semiconductor layer 1150 is, for example, $In_XAl_YGa_{1-x-y}N$ ($0 \leq X$, $0 \leq Y$, and $X+Y<1$), etc.

The semiconductor layer 1150 may be formed on the crystal growth substrate 1001 without the buffer layer 1140 interposed.

Figure 4B:
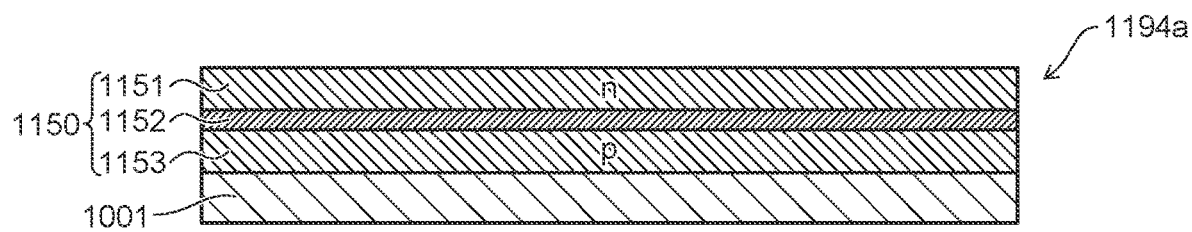
FIG. 4B is a schematic cross-sectional view illustrating the method for manufacturing the image display device of the first embodiment.

In a semiconductor growth substrate 1194a as shown in FIG. 4B, the semiconductor layer 1150 includes the p-type semiconductor layer 1153, the light-emitting layer 1152, and the n-type semiconductor layer 1151 that are stacked on the crystal growth substrate 1001 in this order from the crystal growth substrate 1001 side. Although the semiconductor growth substrate 1194 in which the semiconductor layer 1150 is stacked with the buffer layer 1140 interposed is described hereinbelow, the semiconductor growth substrate 1194a in which there is no buffer layer 1140 also can be similarly manufactured.

Figure 5A:
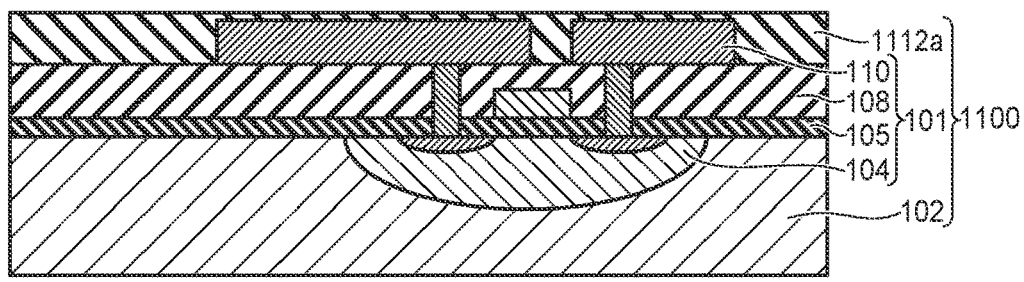
FIG. 5A is a schematic cross-sectional view illustrating the method for manufacturing the image display device of the first embodiment.

A circuit board (a second substrate) 1100 is prepared as shown in FIG. 5A. The circuit board 1100 includes the circuit 101 described with reference to FIG. 1, etc., for the configuration of the subpixel 20. In the circuit board 1100, the circuit 101 is covered with a first insulating layer 1112a. The surface of the first insulating layer 1112a is planarized.

Figure 5B:
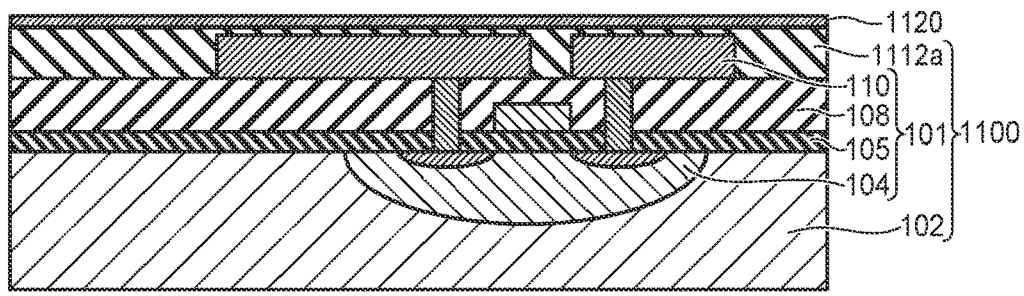
FIG. 5B is a schematic cross-sectional view illustrating the method for manufacturing the image display device of the first embodiment.

As shown in FIG. 5B, a light-shielding layer 1120 is formed on the first insulating layer 1112a. When the light-shielding layer 1120 is a metal, the light-shielding layer 1120 is formed by sputtering, etc. When the light-shielding layer 1120 is not a metal, the light-shielding layer 1120 is formed on the circuit board 1100 by using an appropriate method.

It is favorable for the light-shielding layer 1120 to be formed over the entire surface of the circuit board 1100. When the circuit board 1100 includes the circuits 101 for multiple image display devices, the light-shielding layer 1120 is formed over the entire surface of the circuit 101 for each circuit 101.

Figure 5C:
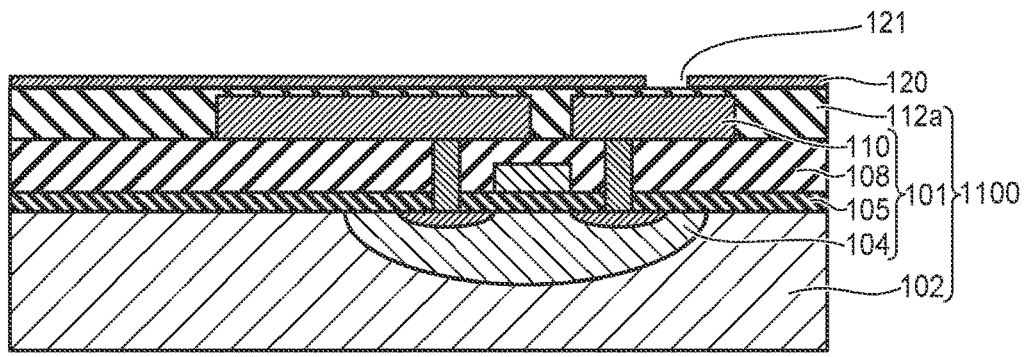
FIG. 5C is a schematic cross-sectional view illustrating the method for manufacturing the image display device of the first embodiment.

As shown in FIG. 5C, the light-shielding layer 1120 of FIG. 5B is made into the light-shielding layer 120 that includes the through-hole 121 by forming the through-hole 121 at an appropriate position when projected onto the XY plane. In the example, the position of the through-hole 121 is a position at which the via 161d (FIG. 1) is inserted. A technique that is appropriate according to the material of the light-shielding layer 1120 is selected to form the through-hole 121. When the light-shielding layer 1120 is a metal such as Al, Ag, etc., the through-hole 121 is formed using dry etching after exposure and development.

Figure 5D:
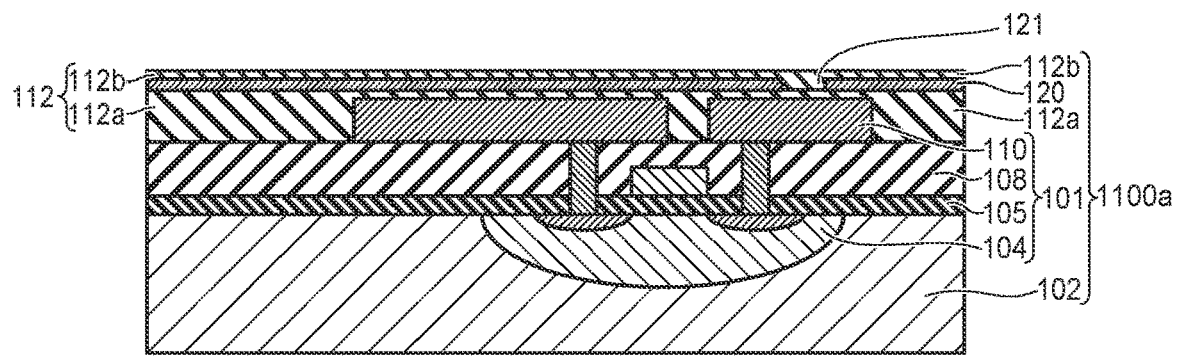
FIG. 5D is a schematic cross-sectional view illustrating the method for manufacturing the image display device of the first embodiment.

As shown in FIG. 5D, the second insulating layer 1112b is formed to cover the light-shielding layer 120 and the first insulating layer 1112a that is exposed in the through-hole 121. The first insulating layer 1112a is the insulating layer after the formation and processing of the light-shielding layer 120 on the first insulating layer 1112a. The second insulating layer 1112b is coated onto the light-shielding layer 120 and the inter-layer insulating film 112 and subsequently fired. Subsequently, if further planarization is necessary, the surface can be further planarized using CMP (Chemical Mechanical Polishing), etc. Thus, a circuit board 1100a is prepared. The circuit board 1100a is a substrate in which the light-shielding layer 120 and the second insulating layer 112b are formed on the circuit board 1100.

Figure 6A:
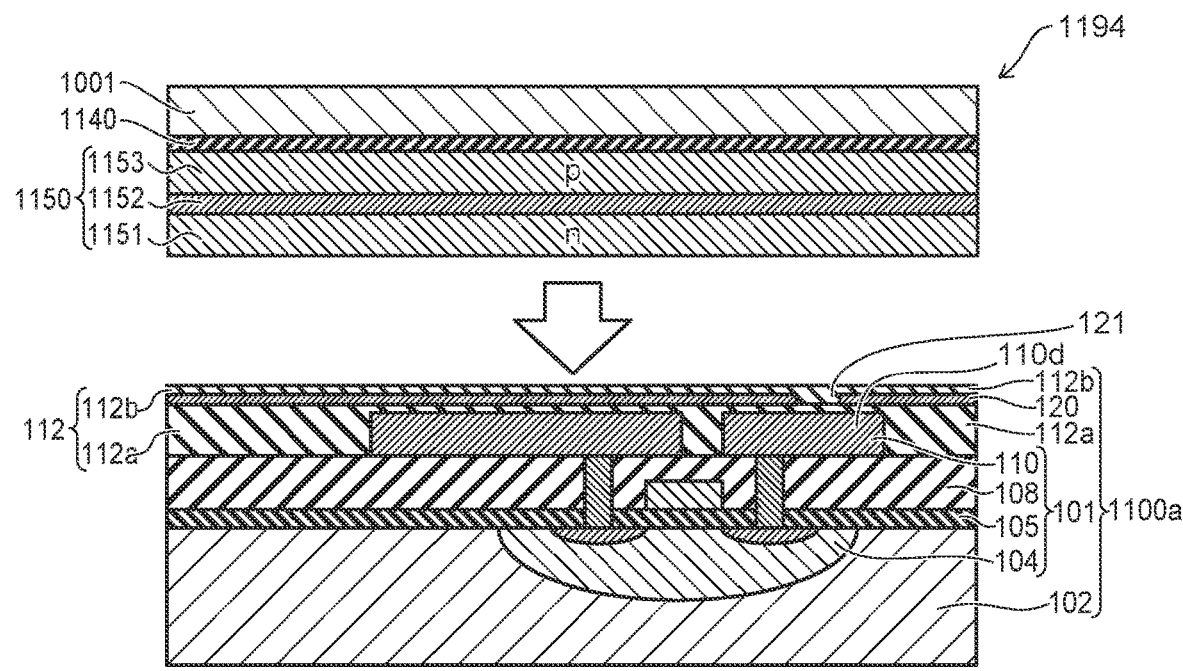
FIG. 6A is a schematic cross-sectional view illustrating the method for manufacturing the image display device of the first embodiment.

As shown in FIG. 6A, one surface of the circuit board 1100a and the surface of the n-type semiconductor layer 1151 of the semiconductor layer 1150 that is not covered are aligned, and the two are bonded. The bonding surface of the circuit board 1100a is the exposed surface of the second insulating layer 112b that is formed on the light-shielding layer 120.

In the wafer bonding that bonds the two substrates, for example, the two substrates are heated, and the two substrates are bonded by thermal compression bonding. A low melting-point metal and/or a low melting-point alloy may be used when performing thermal compression bonding. The low melting-point metal is, for example, Sn, In, etc.; the low melting-point alloy can be, for example, an alloy having Zn, In, Ga, Sn, Bi, etc., as a primary component.

In the wafer bonding, other than the above description, the bonding surfaces of the substrates may be cleaned by plasma processing in a vacuum and closely adhered after planarizing the bonding surfaces by chemical mechanical polishing (Chemical Mechanical Polishing, CMP), etc.

Figure 6B:
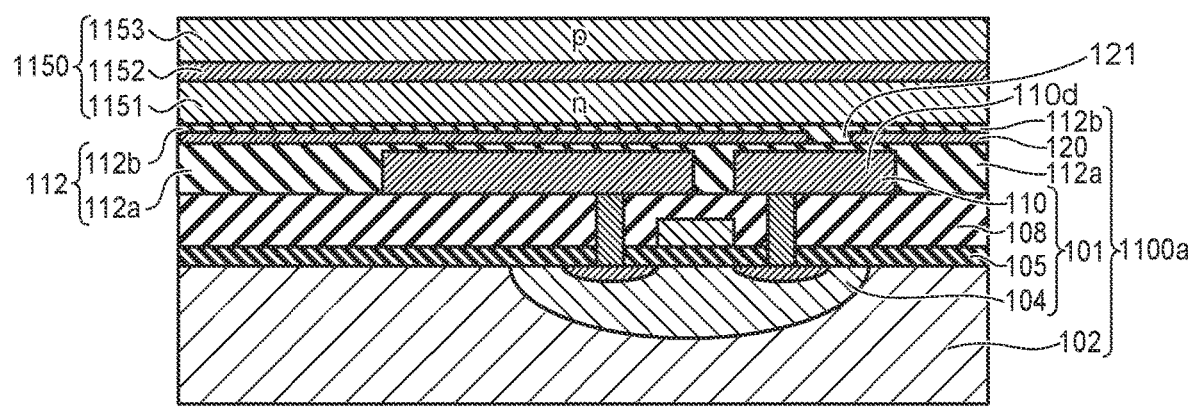
FIG. 6B is a schematic cross-sectional view illustrating the method for manufacturing the image display device of the first embodiment.

As shown in FIG. 6B, the crystal growth substrate 1001 is removed after the circuit board 1100a and the semiconductor layer 1150 are bonded by the wafer bonding. Wet etching, lift-off technology by laser irradiation, etc., may be used to remove the crystal growth substrate 1001.

Figure 7A:
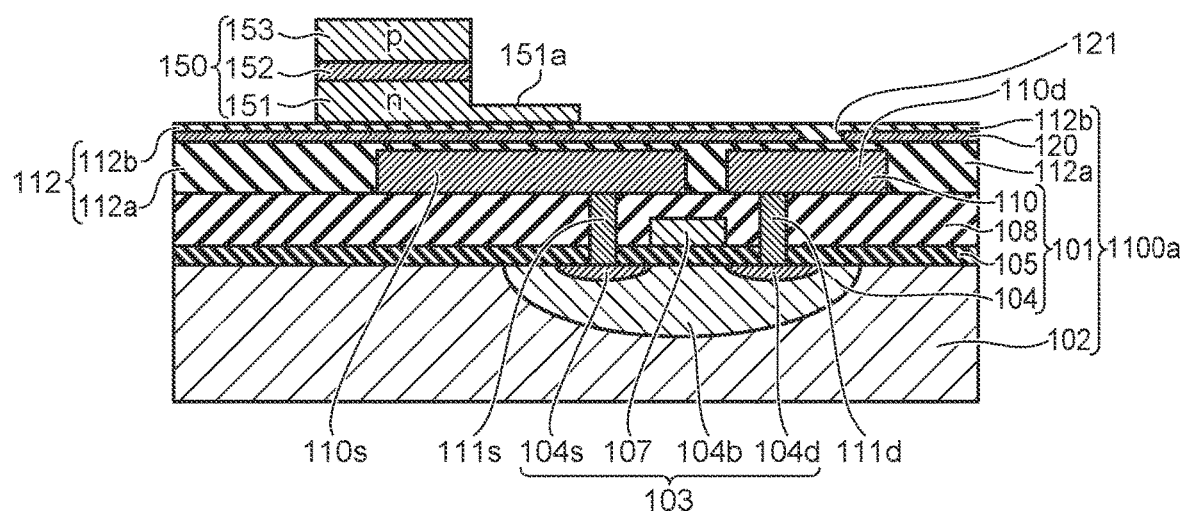
FIG. 7A is a schematic cross-sectional view illustrating the method for manufacturing the image display device of the first embodiment.

As shown in FIG. 7A, the semiconductor layer 1150 shown in FIG. 6B is formed into the shape of the light-emitting element 150. For example, a dry etching process is used to form the light-emitting element 150; it is favorable to use anisotropic plasma etching (Reactive Ion Etching, RIE).

Figure 7B:
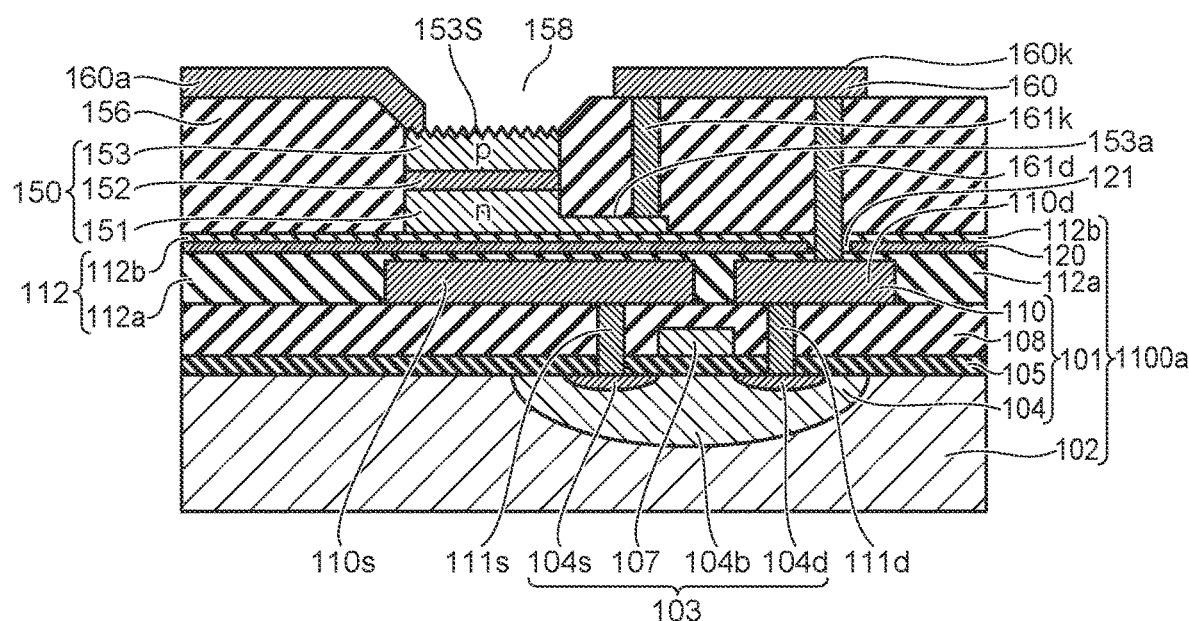
FIG. 7B is a schematic cross-sectional view illustrating the method for manufacturing the image display device of the first embodiment.

As shown in FIG. 7B, the inter-layer insulating film 156 that covers the light-emitting element 150 is formed. The opening 158 is formed in the inter-layer insulating film 156 at a position that corresponds to the light-emitting surface 153S. It is favorable for the light-emitting surface 153S that is exposed in the opening 158 to be roughened.

Via holes are formed in the inter-layer insulating film 156. Subsequently, a conductive material is filled into the via holes. One of wet etching or dry etching can be used to form the via holes.

Subsequently, the wiring layer 160 is formed by sputtering, etc. The vias and the wiring layers 160 may be simultaneously formed after the via holes are formed.

The tip of the wiring portion 160a of the wiring layer 160 is electrically connected to the light-emitting surface 153S. The wiring portion 160k of the wiring layer 160 is electrically connected with the vias 161k and 161d.

Figure 8A:
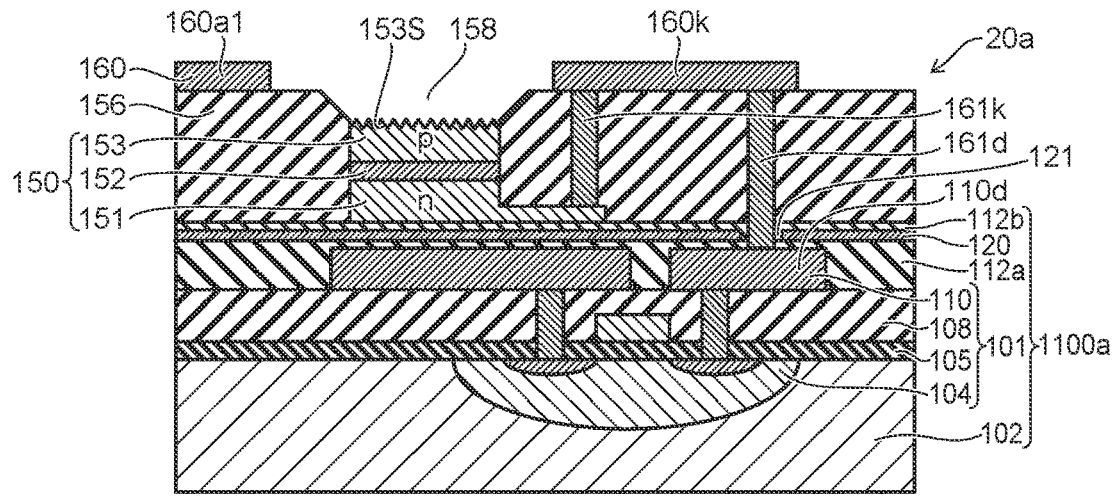
FIG. 8A is a schematic cross-sectional view illustrating a method for manufacturing a modification of the image display device of the first embodiment.
Figure 8B:
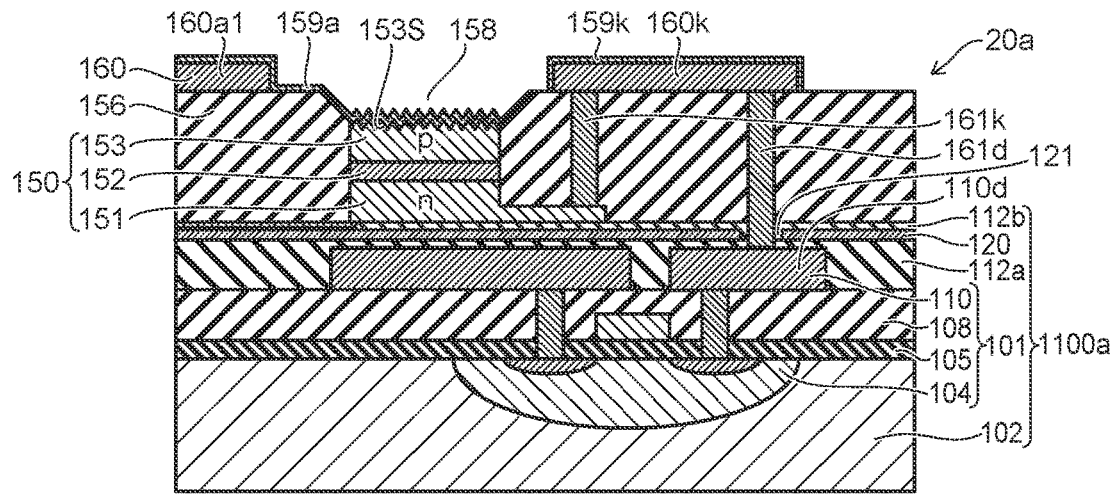
FIG. 8B is a schematic cross-sectional view illustrating the manufacturing method of the modification of the image display device of the first embodiment.
Figure 8C:
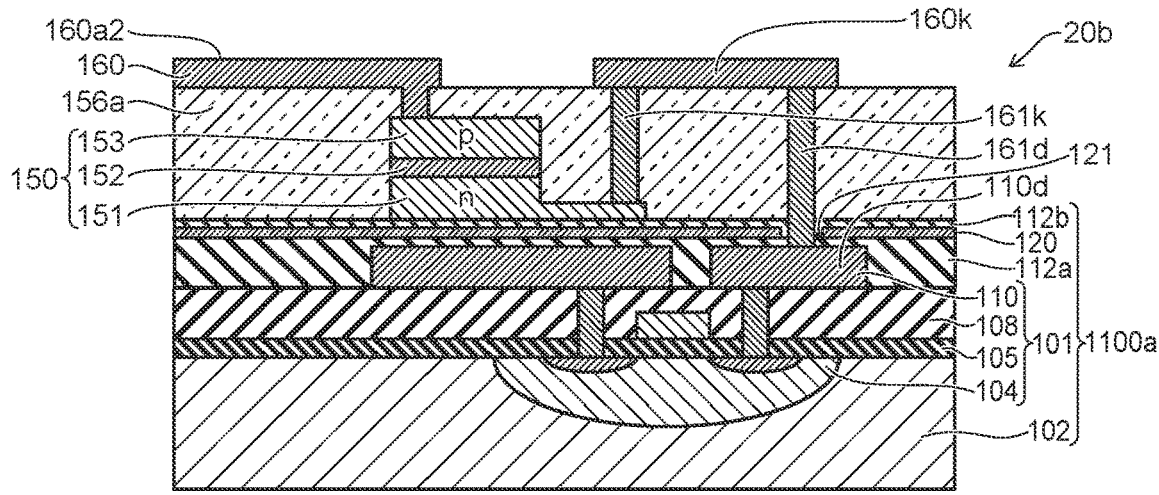
FIG. 8C is a schematic cross-sectional view illustrating a method for manufacturing a modification of the image display device of the first embodiment.

FIGS. 8A to 8C are schematic cross-sectional views illustrating methods for manufacturing the image display devices of the modifications of the embodiment.

FIGS. 8A and 8B show manufacturing processes for forming the subpixel 20a. The modification includes the same processes as those of the first embodiment up to the formation of the light-emitting element 150 and the formation of the second inter-layer insulating film 156. In the description hereinbelow, the processes of FIGS. 8A and 8B are performed after the process of FIG. 7A.

As shown in FIG. 8A, the second inter-layer insulating film 156 is formed on the second insulating layer 112b and the light-emitting element 150, and the light-emitting surface 153S is exposed by forming the opening 158 by etching the inter-layer insulating film 112 that is formed. The etching may be wet etching or dry etching.

Subsequently, the exposed light-emitting surface 153S of the p-type semiconductor layer 153 is roughened to increase the luminous efficiency.

As shown in FIG. 8B, a transparent conductive film that covers the wiring portions 160a1 and 160k of the second wiring layer 160 is formed after the wiring portions 160a1 and 160k are formed. It is favorable for the transparent conductive film to include an ITO film, a ZnO film, etc. The transparent electrodes 159a and 159k are formed by photolithography. The transparent electrode 159a is formed on the wiring portion 160a1 and the light-emitting surface 153S and between the wiring portion 160a1 and the light-emitting surface 153S.

Thus, the subpixel 20a of the modification is formed.

FIG. 8C shows a manufacturing process for forming the subpixel 20b. The example includes the same processes as the modification described above up to the formation of the light-emitting element 150. In the description hereinbelow, the process of FIG. 8C is performed after the process of FIG. 7A.

As shown in FIG. 8C, after the second inter-layer insulating film 156a is formed, the second wiring layer 160 is formed without forming an opening. The wiring portion 160a2 of the wiring layer 160 that is connected to a power supply line is connected to the light-emitting surface 153S via a contact hole of the inter-layer insulating film 156a.

Thus, the subpixel 20b of the modification is formed.

A portion of the circuit other than the subpixels 20, 20a, and 20b is formed in the circuit board 100. For example, the row selection circuit 5 (FIG. 3) can be formed in the circuit board 100 together with the drive transistors, the select transistors, etc. That is, there are cases where the row selection circuit 5 is simultaneously integrated by the manufacturing processes described above. On the other hand, for example, the signal voltage output circuit 7 is mounted to another substrate together with a CPU and other circuit components, and is connected with the wiring portions of the circuit board 100 before assembling the color filter described below or after assembling the color filter.

It is favorable for the circuit board 1100a to be a wafer that includes the circuit 101. The circuit 101 is formed in the circuit board 1100a for one or multiple image display devices. Or, in the case of a larger screen size, etc., the circuit 101 for configuring one image display device may be formed by being subdivided into multiple circuit boards 1100a, and one image display device may be configured by combining all of the subdivided circuits.

It is favorable for the crystal growth substrate 1001 to be a wafer of the same size as the wafer-shaped circuit board 1100a.

Figure 9:
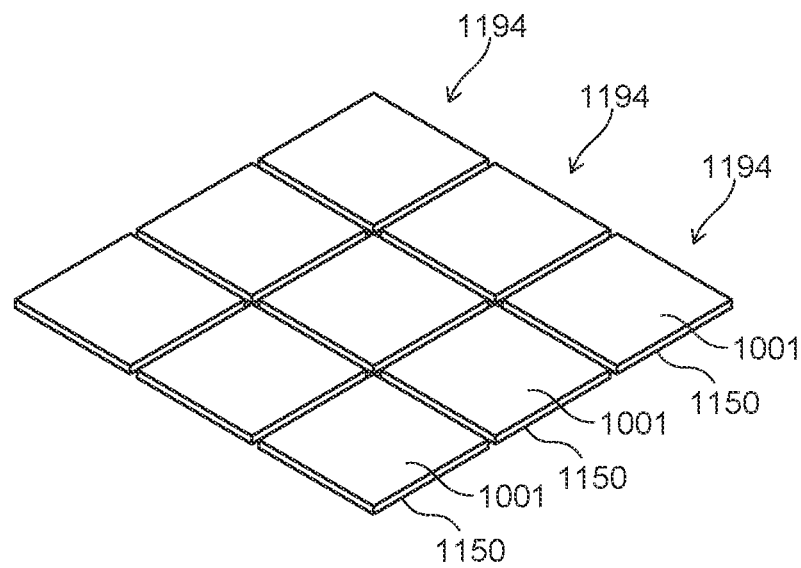
FIG. 9 is a schematic perspective view illustrating the method for manufacturing the image display device of the first embodiment.
Figure 9:
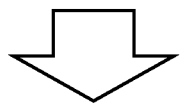
Figure 9:
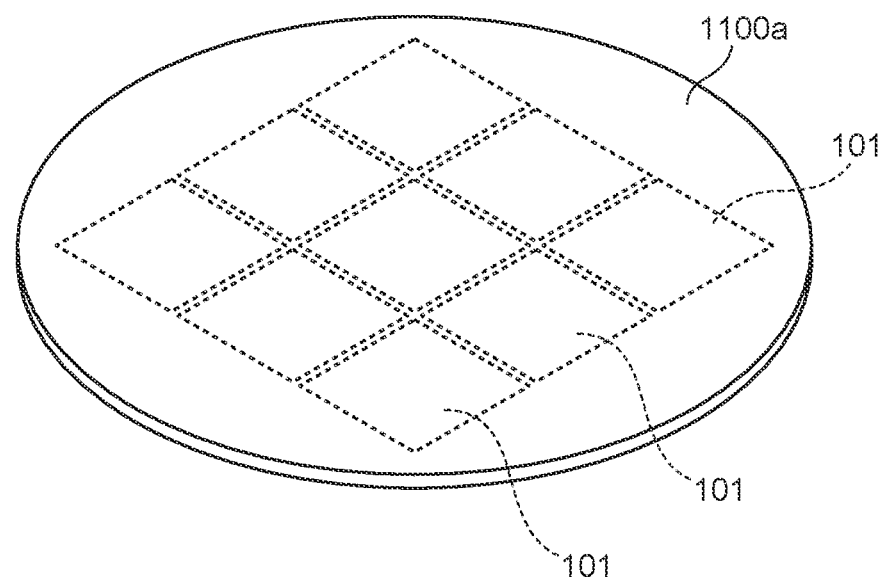

FIG. 9 is a perspective view illustrating the method for manufacturing the image display device of the embodiment.

As shown in FIG. 9, multiple semiconductor growth substrates 1194 may be prepared, and semiconductor layers 1150 that are formed on the multiple crystal growth substrates 1001 may be bonded to one circuit board 1100a.

For example, the multiple circuits 101 are arranged in a lattice configuration in the circuit board 1100a. The circuits 101 include all of subpixels 20, etc., necessary for one image display device 1. A spacing that is about the scribe line width is located between the circuits 101 that are located next to each other. A circuit element or the like is not located at the end portion and the end portion vicinity of the circuit 101.

The semiconductor layer 1150 is formed so that the end portion of the semiconductor layer 1150 is aligned with the end portion of the crystal growth substrate 1001. Therefore, by disposing and bonding so that the end portion of the semiconductor growth substrate 1194 is aligned with the end portion of the circuit 101, the end portion of the semiconductor layer 1150 and the end portion of the circuit 101 can be aligned after bonding.

When growing the semiconductor layer 1150 on the crystal growth substrate 1001, the crystal quality easily degrades at the end portion and the end portion vicinity of the semiconductor layer 1150. Therefore, by aligning the end portion of the semiconductor layer 1150 and the end portion of the circuit 101, the region at which the crystal quality easily degrades that is at the end portion vicinity of the semiconductor layer 1150 on the semiconductor growth substrate 1194 is not used in the display region of the image display device 1.

Or, conversely, multiple circuit boards 1100a may be prepared, and the multiple circuit boards 1100 may be bonded to the semiconductor layer 1150 that is formed on the crystal growth substrate 1001 of one semiconductor growth substrate 1194.

Figure 10:
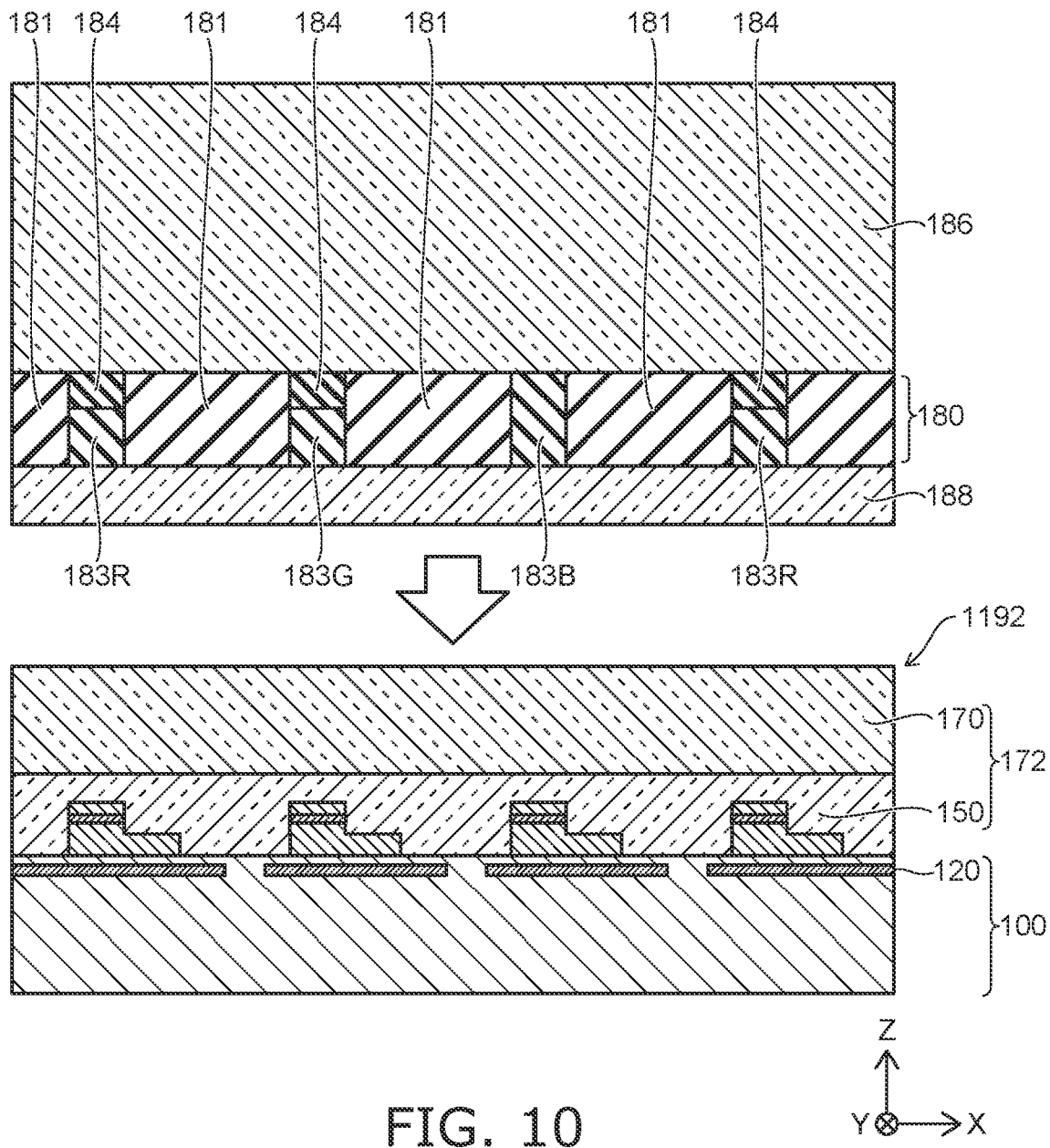
FIG. 10 is a schematic cross-sectional view illustrating the method for manufacturing the image display device of the first embodiment.

FIG. 10 is a schematic cross-sectional view illustrating the method for manufacturing the image display device of the embodiment.

In FIG. 10, the wiring portions that are in the circuit board 100, in the inter-layer insulating films 112 and 156, etc., are not illustrated to avoid complexity. Also, a portion of the color conversion members such as the color filter 180 or the like is displayed in FIG. 10. Here, the structural component that includes a buffer layer 140, the light-emitting element 150, the vias 161k and 161d, the wiring layer 160, the inter-layer insulating film 156, and the surface resin layer 170 is called a light-emitting circuit part 172. Also, the structural component in which the light-emitting circuit part 172 is located on the circuit board 100 is called a structure body 1192.

As shown in FIG. 10, the color filter 180 is bonded to the structure body 1192 at one surface of the color filter 180. The other surface of the color filter 180 is bonded to a glass substrate 186. The transparent thin film adhesive layer 188 is located at the one surface of the color filter 180, and the bonding to the surface of the structure body 1192 at the light-emitting circuit part 172 side is performed via the transparent thin film adhesive layer 188.

In the color filter 180 of the example, the color conversion parts are arranged in the positive direction of the X-axis in the order of red, green, and blue. Respectively for red and green, a red color conversion layer 183R and a green color conversion layer 183G are located in the first layer, and the filter layers 184 are located in the second layer. For blue, a single-layer color conversion layer 183B is located. The light-shielding part 181 is located between the color conversion parts.

The color filter 180 is adhered to the structure body 1192 so that the positions of the color conversion layers 183R, 183G, and 183B of each color match the positions of the light-emitting elements 150.

FIGS. 11A to 11D are schematic cross-sectional views showing a modification of the method for manufacturing the image display device of the embodiment.

A method in which the color filter is formed by inkjet is shown in FIGS. 11A to 11D.

Figure 11A:
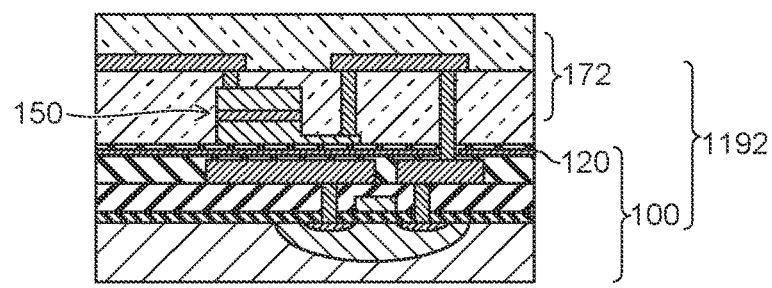
FIG. 11A is a schematic cross-sectional view illustrating a modification of the method for manufacturing the image display device of the first embodiment.

As shown in FIG. 11A, the structure body 1192 in which the light-emitting circuit part 172 is bonded to the circuit board 100 is prepared.

Figure 11B:
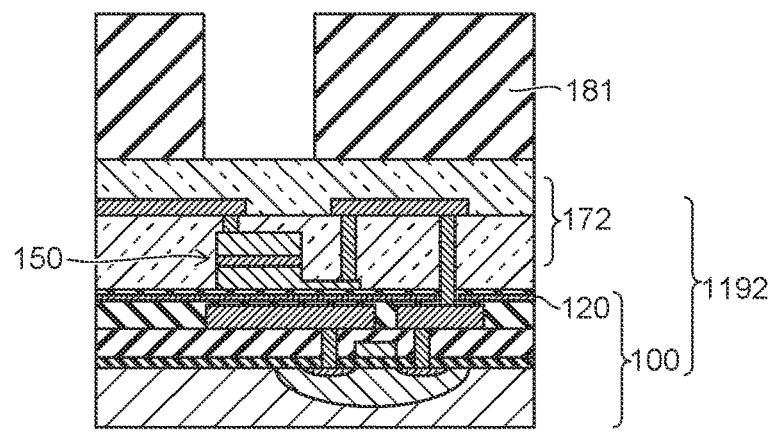
FIG. 11B is a schematic cross-sectional view illustrating the modification of the method for manufacturing the image display device of the first embodiment.

As shown in FIG. 11B, the light-shielding part 181 is formed on the structure body 1192. For example, the light-shielding part 181 is formed using screen printing, photolithography technology, etc.

Figure 11C:
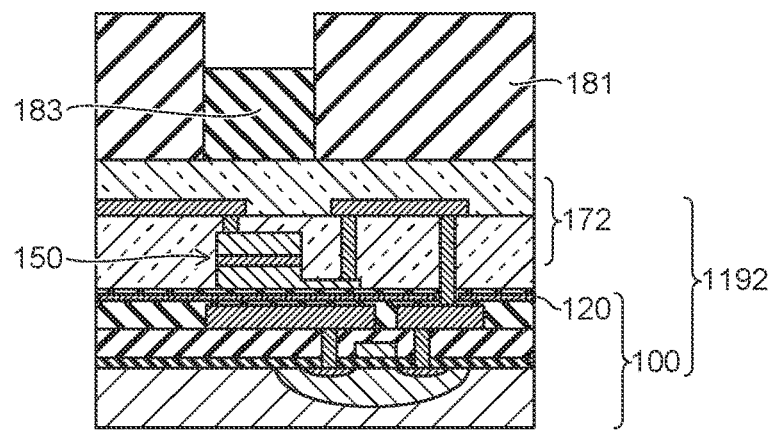
FIG. 11C is a schematic cross-sectional view illustrating the modification of the method for manufacturing the image display device of the first embodiment.

As shown in FIG. 11C, the color conversion layer 183 is formed by dispensing a fluorescer that corresponds to the light emission color from an inkjet nozzle. The fluorescer colors the region in which the light-shielding part 181 is not formed. The fluorescer includes, for example, a fluorescent coating that uses a general fluorescer material or a quantum dot fluorescer material. It is favorable to use a quantum dot fluorescer material because the light emission colors can be realized, the monochromaticity can be high, and the color reproducibility can be high. After the printing by the inkjet nozzle, drying processing is performed using an appropriate temperature and time. The thickness of the coating when coloring is set to be less than the thickness of the light-shielding part 181.

As described above, the fluorescer may not be dispensed in the subpixel of the blue light emission because the color conversion part may not be formed. Also, when a blue color conversion layer is formed in the subpixel of the blue light emission, the color conversion part may be one layer; therefore, it is favorable for the thickness of the coated film of the blue fluorescer to be about equal to the thickness of the light-shielding part 181.

Figure 11D:
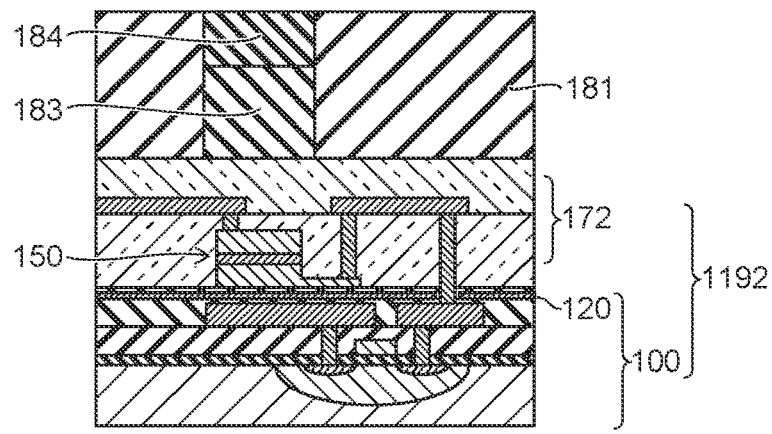
FIG. 11D is a schematic cross-sectional view illustrating the modification of the method for manufacturing the image display device of the first embodiment.

As shown in FIG. 11D, a coating for the filter layer 184 is dispensed from the inkjet nozzle. The coating is coated to overlap the coated film of the fluorescer. The total thickness of the coating and the coated film of the fluorescer is set to be about equal to the thickness of the light-shielding part 181.

Thus, the image display device 1 can be manufactured.

Effects of the image display device 1 of the embodiment will now be described.

According to the method for manufacturing the image display device 1 of the embodiment, the semiconductor layer 1150 that includes the light-emitting layer 1152 for the light-emitting element 150 is bonded to the circuit board 1100a that includes the circuit elements such as the transistor 103 that drives the light-emitting element 150, etc. Subsequently, the light-emitting element 150 is formed by etching the semiconductor layer 1150. Therefore, compared to individually transferring singulated light-emitting elements onto the circuit board 1100a, the process of transferring the light-emitting elements can be markedly shortened.

For example, in an image display device having 4K image quality, the number of subpixels is greater than 24 million, and in the case of an image display device having 8K image quality, the number of subpixels is greater than 99 million. When individually mounting such a large amount of light-emitting elements to a circuit board, an enormous amount of time is necessary, and it is difficult to realize an image display device that uses micro LEDs at a realistic cost. Also, when individually mounting a large amount of light-emitting elements, the yield decreases due to connection defects when mounting, etc., and an even higher cost is unavoidable.

Conversely, according to the method for manufacturing the image display device 1 of the embodiment, the entire semiconductor layer 1150 is bonded to the circuit board 1100a before singulating the semiconductor layer 1150; therefore, the transfer process is completed when performed 1 time.

After directly forming the light-emitting element on the circuit board by etching, etc., the light-emitting element and the circuit element in the circuit board 1100a (100) are electrically connected by forming vias; therefore, a uniform connection structure can be realized, and the decrease of the yield can be suppressed.

Also, alignment is unnecessary because the bonding to the circuit board 1100a is performed at the wafer level without pre-singulating the semiconductor layer 1150 or forming electrodes at positions corresponding to the circuit elements. Therefore, the adhesion process can be easily performed in a short period of time. The alignment is unnecessary when bonding, which is favorable for a higher definition display; also, reducing the size of the light-emitting element 150 is easy.

In the image display device 1 of the embodiment, the subpixel includes the light-shielding layer 120 between the circuit element and the light-emitting element 150. Because the light-shielding layer 120 can be provided to cover all of the subpixels, the light from the light-emitting element 150 can be prevented from reaching the circuit elements such as the transistor 103, etc., and malfunction of the circuit elements due to the irradiation of the light can be prevented.

The light-shielding layer 120 can be formed of a conductive material. By forming the light-shielding layer 120 of a conductive material, the light-shielding layer 120 can be light-reflective; therefore, the scattering of the light of the light-emitting element 150 toward the light-shielding layer 120 side can be reflected toward the light-emitting surface 153S side. Therefore, the luminous efficiency of the subpixel can be increased.

The second insulating layer 112b is located between the light-shielding layer 120 and the light-emitting element 150. When the light-shielding layer 120 is conductive, the circuit element and the light-emitting element 150 can be insulated by the second insulating layer 112b. Any constant voltage can be applied to the light-shielding layer 120, and electromagnetic radiation that is generated by the operation of the circuit elements can be suppressed.

Second Embodiment

Figure 12:
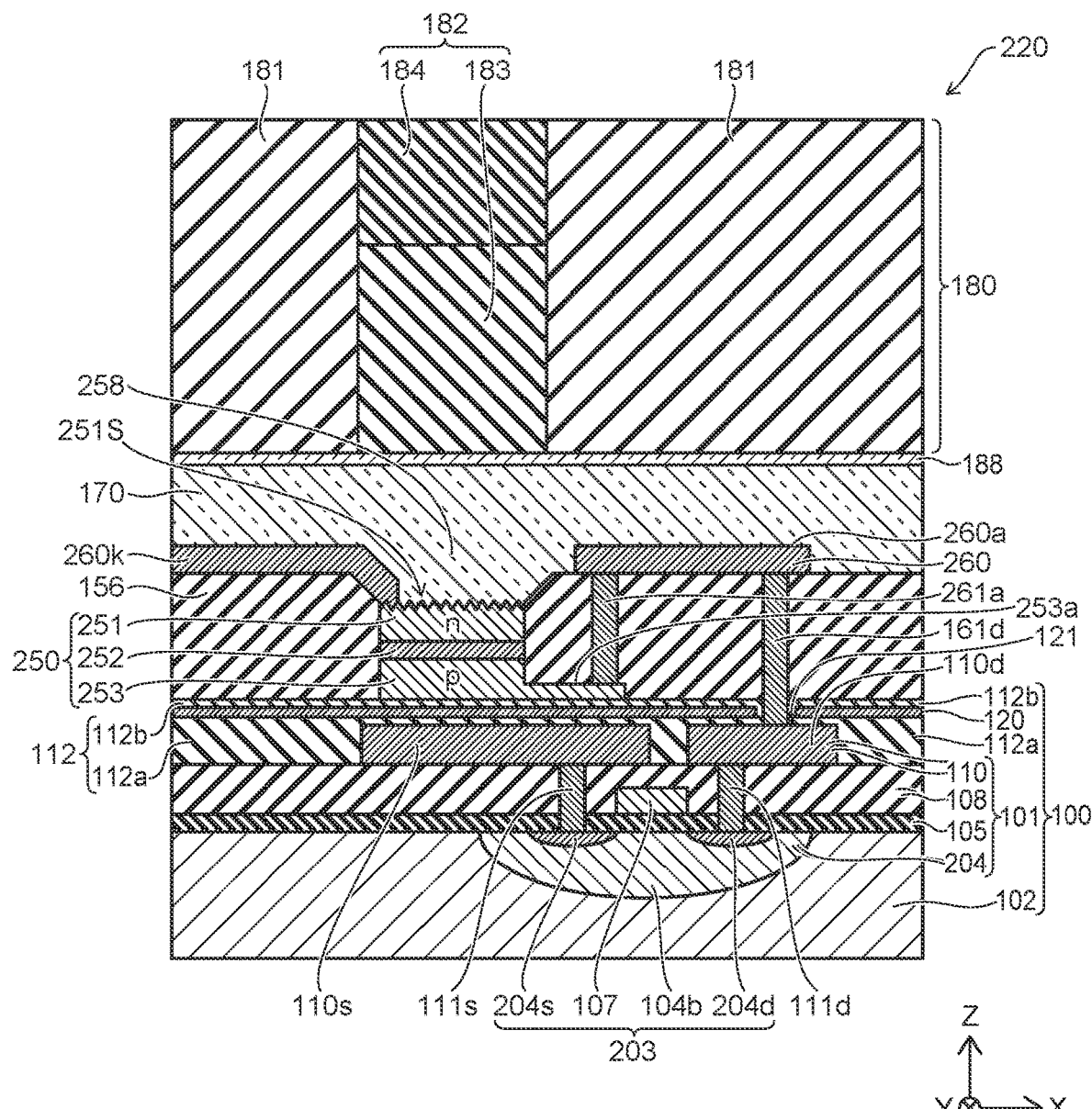
FIG. 12 is a schematic cross-sectional view illustrating a portion of an image display device according to a second embodiment.

FIG. 12 is a schematic cross-sectional view illustrating a portion of an image display device according to the embodiment.

The configuration of a light-emitting element 250 and the configuration of a transistor 203 that drives the light-emitting element 250 according to the embodiment are different from those of the other embodiments described above. The same components as those of the other embodiments described above are marked with the same reference numerals, and a detailed description is omitted as appropriate.

As shown in FIG. 12, a subpixel 220 of the image display device of the embodiment includes the transistor 203 and the light-emitting element 250. The transistor 203 is formed in an element formation region 204 that is formed in the substrate 102. The element formation region 204 includes an n-type semiconductor region 204b and p-type semiconductor regions 204s and 204d. The n-type semiconductor region 204b is located at the surface vicinity of the substrate 102. The p-type semiconductor regions 204s and 204d are located in the n-type semiconductor region 204b and are separated from each other at the surface vicinity of the n-type semiconductor region 204b.

The gate 107 is located on the n-type semiconductor region 204b with the insulating layer 105 interposed. The gate 107 is located between the p-type semiconductor regions 204s and 204d.

The structure of the upper portion of the transistor 203 and the structure of the wiring portions are the same as those of the other embodiments described above. According to the embodiment, the transistor 203 is a p-channel transistor, e.g., a p-channel MOSFET.

The light-emitting element 250 includes a p-type semiconductor layer (a first semiconductor layer) 253, a light-emitting layer 252, and an n-type semiconductor layer (a second semiconductor layer) 251. The p-type semiconductor layer 253, the light-emitting layer 252, and the n-type semiconductor layer 251 are stacked in this order from the first inter-layer insulating film 112 of the circuit board 100 toward a light-emitting surface 251S. Although the light-emitting element 250 has, for example, a substantially square or rectangular shape when projected onto the XY plane, the corners may be rounded. The light-emitting element 250 may have, for example, an elliptical shape or a circular shape when projected onto the XY plane. The degree of freedom of the layout is increased by appropriately selecting the shape, arrangement, and the like of the light-emitting element when viewed in plan. In the example, the p-type semiconductor layer 253 includes a step portion 253a that extends in the X-axis direction on the first inter-layer insulating film 112.

The light-emitting element 250 may include the same materials as those of the other embodiments described above. For example, the light-emitting element 250 emits blue light of about 467 nm±20 nm, or bluish-violet light of a wavelength of 410 nm±20 nm.

The second inter-layer insulating film (the second insulating film) 156 covers the first inter-layer insulating film 112 and the light-emitting element 250. The second inter-layer insulating film 156 includes an opening 258. The opening 258 is formed on the light-emitting element 250, and the inter-layer insulating film 156 is not located on the light-emitting surface 251S of the light-emitting element 250. It is favorable for the inter-layer insulating film 156 to include a white resin that reflects the light emitted by the light-emitting element 250 and effectively outputs the light from the opening 258.

The light-emitting surface 251S is the surface of the n-type semiconductor layer 251 that is opposite to the surface contacting the light-emitting layer 252. The light-emitting surface 251S is roughened.

A via 261a is provided to extend through the inter-layer insulating film 156. One end of the via 261a is connected to the step portion 253a.

The via 161d is provided to extend through the inter-layer insulating films 112 and 156. One end of the via 161d is connected to the wiring portion 110d.

A wiring layer 260 is located on the inter-layer insulating film 156. The wiring layer 260 includes wiring portions 260k and 260a. The wiring portion 260a is connected to the other ends of the vias 261a and 161d. Accordingly, the p-type semiconductor layer 253 of the light-emitting element 250 is electrically connected to the main electrode of the transistor 203 by the vias 261a and 161d and the wiring portion 260a.

The wiring portion 260k is connected to a ground line that is not illustrated. Accordingly, the n-type semiconductor layer 251 is connected to the ground line via the wiring portion 260k.

The surface resin layer 170 is located on the inter-layer insulating film 156 and the wiring layer 260.

Figure 13:
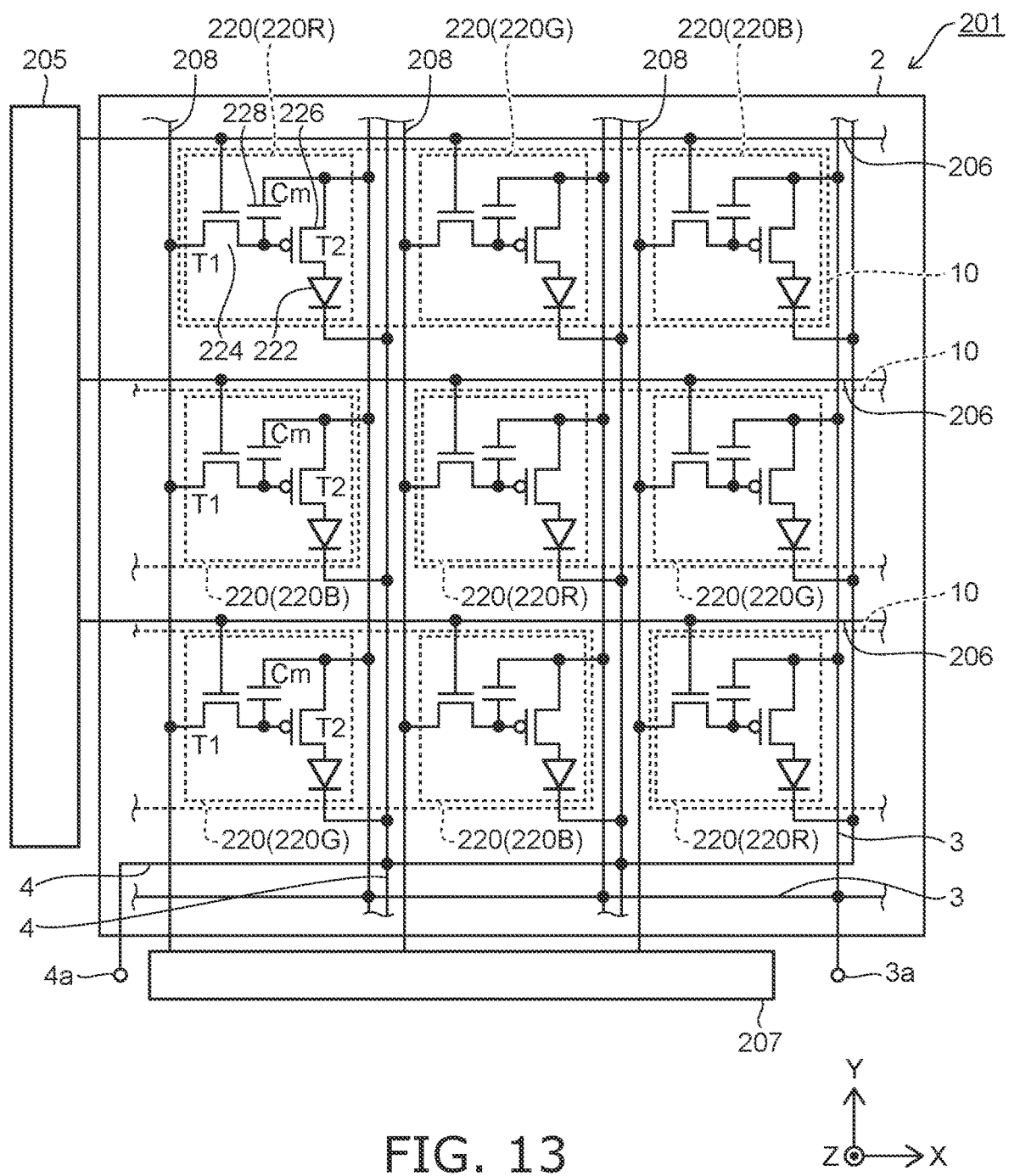
FIG. 13 is a schematic block diagram illustrating the image display device of the second embodiment.

FIG. 13 is a schematic block diagram illustrating the image display device according to the embodiment.

As shown in FIG. 13, the image display device 201 of the embodiment includes the display region 2, a row selection circuit 205, and a signal voltage output circuit 207. Similarly to the other embodiments described above, for example, the subpixels 220 are arranged in a lattice configuration in the display region 2.

The subpixel 220 includes a light-emitting element 222, a select transistor 224, a drive transistor 226, and a capacitor 228. In FIG. 13, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a higher potential side than the light-emitting element 222. The drive transistor 226 is a p-channel MOSFET.

The select transistor 224 is connected between a signal line 208 and a gate electrode of the drive transistor 226. The capacitor 228 is connected between the power supply line 3 and the gate electrode of the drive transistor 226.

The polarities of the signal voltages supplied by the row selection circuit 205 and the signal voltage output circuit 207 to a scanning line 206 and the signal line 208 to drive the drive transistor 226 that is a p-channel MOSFET are different from those of the other embodiments described above.

According to the embodiment, the polarity of the drive transistor 226 is a p-channel; therefore, the polarities of the signal voltages, etc., are different from those of the other embodiments described above. In other words, the row selection circuit 205 supplies a select signal to the scanning line 206 to sequentially select one row from the arrangement of the m rows of the subpixels 220. The signal voltage output circuit 207 supplies signal voltages that have analog voltage values necessary for the subpixels 220 of the selected row. The drive transistors 226 of the subpixels 220 of the selected row cause currents that correspond to the signal voltages to flow in the light-emitting elements 222. The light-emitting elements 222 emit light of luminances corresponding to the currents that flow.

A method for manufacturing the image display device 201 of the embodiment will now be described.

FIGS. 14A to 15C are schematic cross-sectional views illustrating the method for manufacturing the image display device of the embodiment.

According to the embodiment, the semiconductor growth substrate 1194 that is already described with reference to FIG. 5A is used. The processes from the preparation of the semiconductor growth substrate 1194 that includes the semiconductor layer 1150 that is epitaxially grown on the crystal growth substrate 1001 with the buffer layer 1140 interposed will now be described.

Figure 14A:
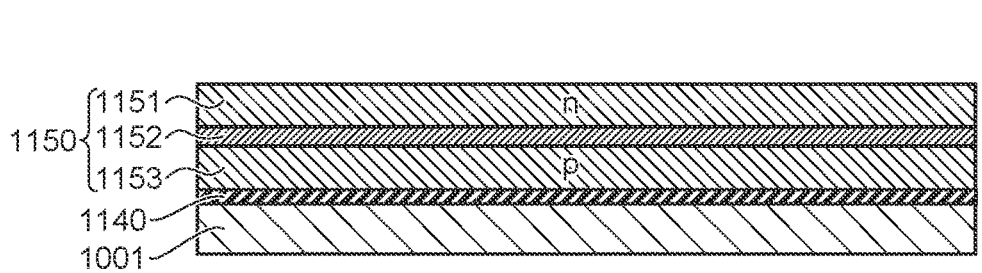
FIG. 14A is a schematic cross-sectional view illustrating a method for manufacturing the image display device of the second embodiment.

According to the embodiment as shown in FIG. 14A, the semiconductor layer 1150 includes the p-type semiconductor layer 1153, the light-emitting layer 1152, and the n-type semiconductor layer 1151 that are stacked by growing on the crystal growth substrate 1001 in this order from the crystal growth substrate 1001 side with the buffer layer 1140 interposed.

Figure 14B:
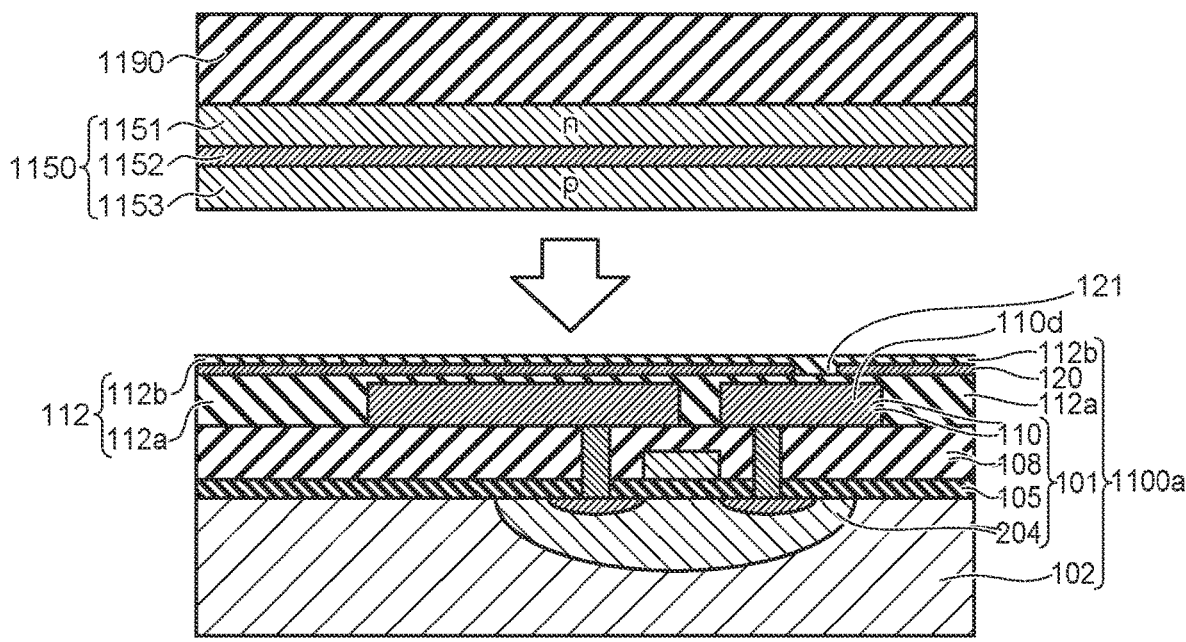
FIG. 14B is a schematic cross-sectional view illustrating the method for manufacturing the image display device of the second embodiment.

As shown in FIG. 14B, a support substrate 1190 is bonded to the surface of the n-type semiconductor layer 1151 that is not covered. For example, the support substrate 1190 is formed of Si, quartz, etc. Subsequently, the crystal growth substrate 1001 is removed. For example, wet etching or a laser is used to remove the crystal growth substrate 1001. Also, the buffer layer 1140 is removed when removing the crystal growth substrate 1001 or after removing of the crystal growth substrate 1001.

The circuit board 1100a in which the light-shielding layer 120 is formed in the first inter-layer insulating film 112 is prepared, and the semiconductor layer 1150 that is bonded to the support substrate 1190 is bonded to the circuit board 1100a. The circuit board 1100a is prepared by the manufacturing processes described above with reference to FIGS. 5A to 5D. The bonding surface of the semiconductor layer 1150 is the surface of the p-type semiconductor layer 1153 that is not covered, and the bonding surface of the circuit board 1100a is a surface formed by planarizing the second insulating layer.

Figure 14C:
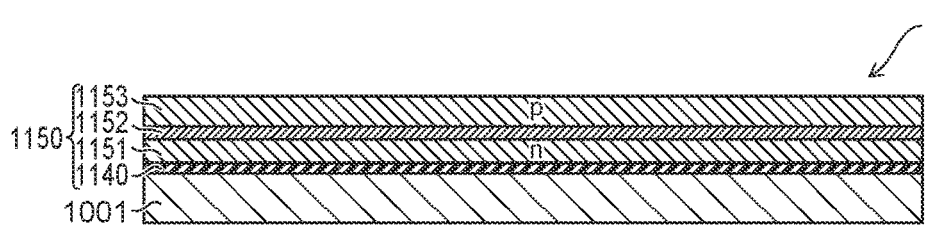
FIG. 14C is a schematic cross-sectional view illustrating the method for manufacturing the image display device of the second embodiment.

According to the embodiment as shown in FIG. 14C, a semiconductor growth substrate 1294 may be used instead of the semiconductor growth substrate 1194. The semiconductor growth substrate 1294 includes the n-type semiconductor layer 1151, the light-emitting layer 1152, and the p-type semiconductor layer 1153 stacked on the crystal growth substrate 1001 in this order from the crystal growth substrate 1001 side with the buffer layer 1140 interposed. When the semiconductor growth substrate 1294 is used, as described in the manufacturing method according to the first embodiment described above, the surface of the n-type semiconductor layer 1151 of the semiconductor growth substrate 1294 that is exposed is bonded to the surface of the circuit board 1100a. Similarly to the description of the manufacturing method according to the first embodiment, the semiconductor layer 1150 may be grown on the crystal growth substrate 1001 without interposing the buffer layer 1140.

In the initial state of the crystal growth, crystal defects that are caused by mismatch of the crystal lattice constants occur easily, and such a crystal is of the n-type. Therefore, it is advantageous to use the semiconductor growth substrate 1294 that is stacked from the n-type semiconductor layer 1151 because the margin of the production processes is increased, and the yield is easily increased.

Figure 15A:
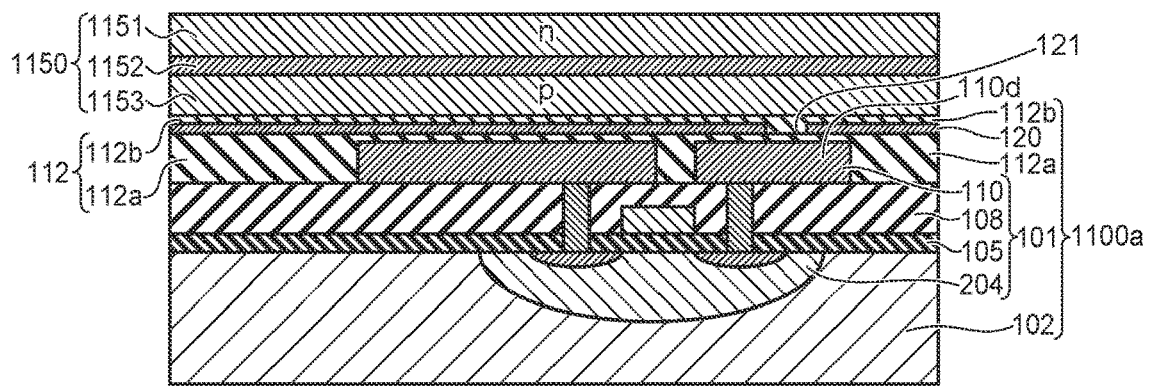
FIG. 15A is a schematic cross-sectional view illustrating the method for manufacturing the image display device of the second embodiment.

As shown in FIG. 15A, the support substrate 1190 is removed after bonding the semiconductor layer 1150 and the circuit board 1100a.

Figure 15B:
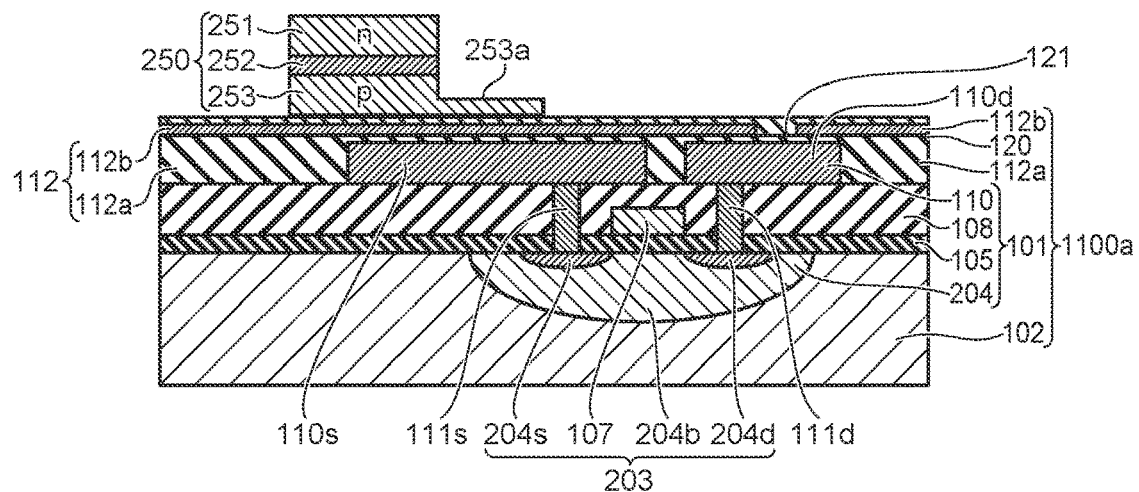
FIG. 15B is a schematic cross-sectional view illustrating the method for manufacturing the image display device of the second embodiment.

As shown in FIG. 15B, the semiconductor layer 1150 is formed into the shape of the light-emitting element 250. For example, a dry etching process is used to form the light-emitting element 150, and it is favorable to use anisotropic plasma etching (Reactive Ion Etching, RIE).

Figure 15C:
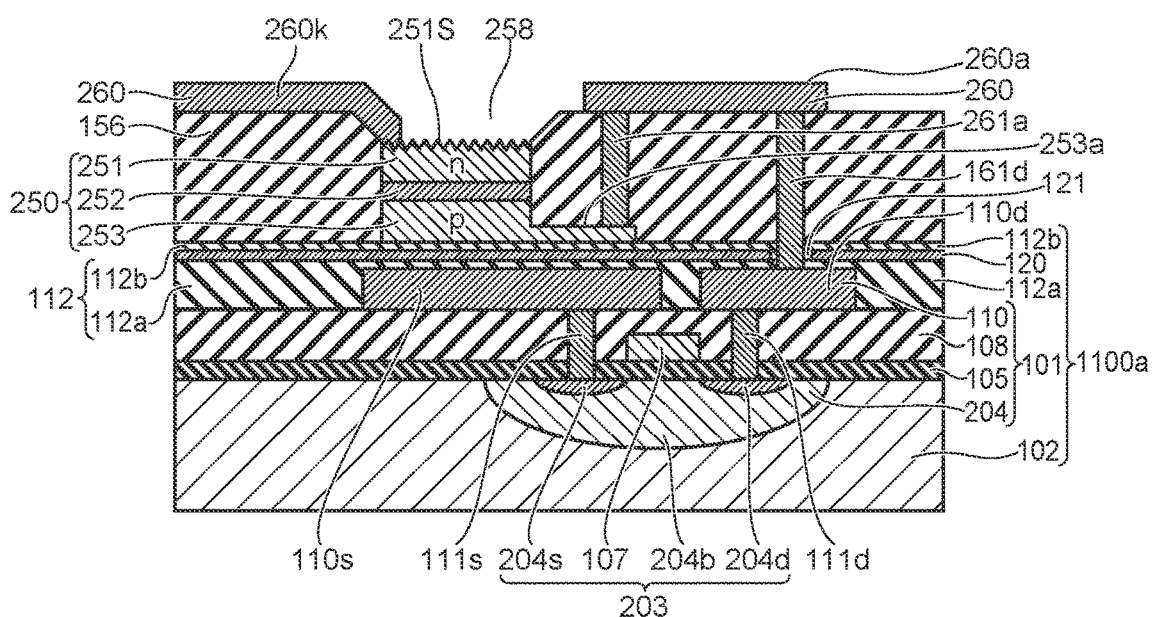
FIG. 15C is a schematic cross-sectional view illustrating the method for manufacturing the image display device of the second embodiment.

As shown in FIG. 15C, the second inter-layer insulating film 156 that covers the first inter-layer insulating film 112 and the light-emitting element 250 is formed. The light-emitting surface 251S is exposed by forming the opening 258 in the inter-layer insulating film 156 at a position that corresponds to the light-emitting surface 251S, and it is favorable for the light-emitting surface 251S to be roughened.

Via holes are formed in the inter-layer insulating film 156. A conductive metal material is filled into the via holes.

Subsequently, the wiring layer 260 is formed by sputtering, etc. The wiring portions 260k and 260a are formed by photolithography. The wiring portion 260a is connected to the vias 261a and 161d. The wiring portion 260k is connected to the ground line 4 shown in FIG. 13.

Effects of the image display device 201 of the embodiment will now be described.

The embodiment also includes effects similar to those of the other embodiments described above. Namely, the individual light-emitting elements 250 are formed by etching after bonding the semiconductor layer 1150 to the circuit board 1100a; therefore, the transfer process of the light-emitting elements can be markedly shortened.

In addition to the effects of the other embodiments described above, according to the embodiment, the n-type semiconductor layer 251 can be roughened more easily by using the n-type semiconductor layer 251 as the light-emitting surface 251S, and a subpixel that has a high luminous efficiency can be formed by connecting a wiring portion 260k1 to the light-emitting surface 251S.

Third Embodiment

According to the embodiment, an image display device that has a higher luminous efficiency is realized by forming multiple light-emitting surfaces that correspond to multiple light-emitting elements in a single semiconductor layer that includes a light-emitting layer. In the description hereinbelow, the same components as those of the other embodiments described above are marked with the same reference numerals, and a detailed description is omitted as appropriate.

Figure 16:
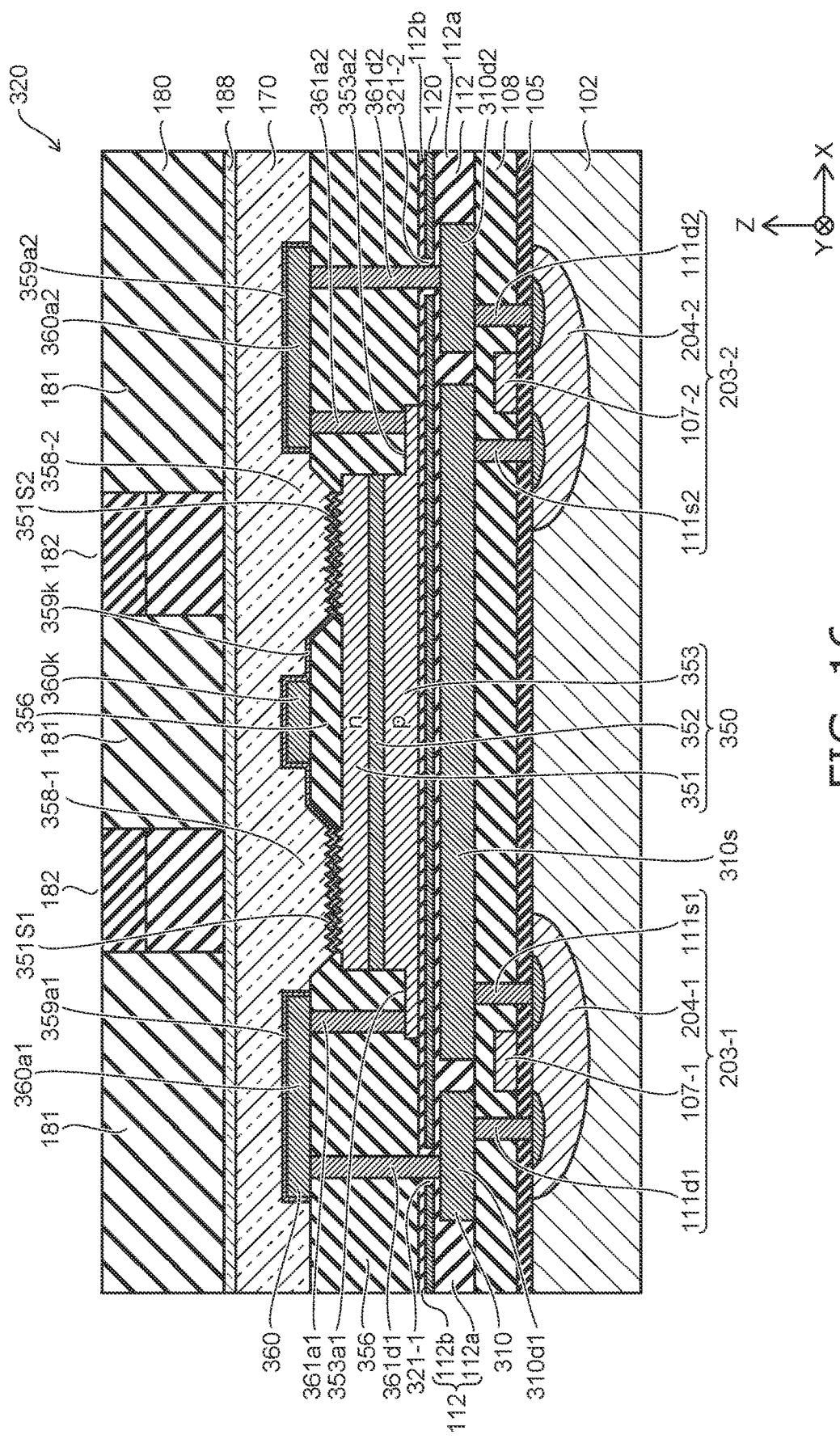
FIG. 16 is a schematic cross-sectional view illustrating a portion of an image display device according to a third embodiment.

FIG. 16 is a schematic cross-sectional view illustrating a portion of the image display device according to the embodiment.

As shown in FIG. 16, the image display device includes a subpixel group 320. The subpixel group 320 includes transistors 203-1 and 203-2, a first wiring layer 310, the first inter-layer insulating film 112, the light-shielding layer 120, a semiconductor layer 350, a second inter-layer insulating film 356, a second wiring layer 360, and vias 361d1 and 361d2.

According to the embodiment, by switching the p-channel transistors 203-1 and 203-2 on, holes are injected into the semiconductor layer 350 by the vias 361d1 and 361d2, electrons are injected into the semiconductor layer 350 via the second wiring layer 360, and a light-emitting layer 352 is caused to emit light. The circuit configuration of FIG. 13 is applied to the drive circuit. Using the other embodiments described above, the n-type semiconductor layer and the p-type semiconductor layer of the semiconductor layers may be vertically interchanged. The semiconductor layers are driven by n-channel transistors. In such a case, the circuit configuration of FIG. 3 is applied to the drive circuit.

The semiconductor layer 350 includes two light-emitting surfaces 351S1 and 351S2, and the subpixel group 320 substantially includes two subpixels. According to the embodiment, similarly to the other embodiments described above, a display region is formed by arranging the subpixel group 320 that substantially includes two subpixels in a lattice configuration.

The transistors 203-1 and 203-2 are formed respectively in element formation regions 204-1 and 204-2. In the example, the element formation regions 204-1 and 204-2 are n-type semiconductor layers, and p-type semiconductor layers are formed to be separated from each other in the n-type semiconductor layer. The n-type semiconductor layer includes a channel region, and the p-type semiconductor layers respectively include a source region and a drain region.

The insulating layer 105 is formed on the element formation regions 204-1 and 204-2, and gates 107-1 and 107-2 each are formed with the insulating layer 105 interposed. The gates 107-1 and 107-2 are gates of the transistors 203-1 and 203-2. The transistors 203-1 and 203-2 are p-channel transistors, e.g., p-channel MOSFETs.

The insulating film 108 covers the tops of the two transistors 203-1 and 203-2. The wiring layer 310 is formed on the insulating film 108.

Vias 111s1 and 111d1 are located respectively between the wiring layer 310 and the p-type semiconductor layers of the transistor 203-1. Vias 111s2 and 111d2 are located between the wiring layer 310 and the p-type semiconductor layers of the transistor 203-2.

The first wiring layer 310 includes wiring portions 310s, 310d1, and 310d2. The wiring portion 310s is electrically connected to the p-type semiconductor layers that correspond to the source electrodes of the transistors 203-1 and 203-2 by the vias 111s1 and 111s2. The wiring portion 310s is connected to a power supply line that is not illustrated.

The wiring portions 310d1 and 310d2 are connected respectively to the p-type semiconductor layers that correspond to the drain electrodes of the transistors 203-1 and 203-2 by the vias 111d1 and 111d2.

The first inter-layer insulating film 112 includes the first insulating layer 112a and the second insulating layer 112b. The first insulating layer 112a covers the wiring layer 310 and the insulating film 108. The light-shielding layer 120 is located on the first insulating layer 112a. The light-shielding layer 120 includes through-holes 321-1 and 321-2. The second insulating layer 112b covers the light-shielding layer 120 and the first insulating layer 112a that is exposed in the through-holes 321-1 and 321-2.

The through-holes 321-1 and 321-2 of the light-shielding layer 120 are located at positions that correspond respectively to the wiring portions 310d1 and 310d2 that are connected to the drain electrodes of the transistors 203-1 and 203-2 when projected onto the XY plane. The vias 361d1 and 361d2 are inserted respectively into the through-holes 321-1 and 321-2. The material of the second insulating layer 112b is filled between the through-hole 321-1 and a via 161d1, and the through-hole 321-1 and the via 161d1 are electrically insulated. The material of the second insulating layer 112b is filled between the through-hole 321-2 and a via 161d2, and the through-hole 321-2 and the via 161d2 are electrically insulated.

The semiconductor layer 350 is located on the light-shielding layer 120 with the second insulating layer 112b interposed. The semiconductor layer 350 includes a p-type semiconductor layer 353, the light-emitting layer 352, and an n-type semiconductor layer 351. The semiconductor layer 350 includes the p-type semiconductor layer 353, the light-emitting layer 352, and the n-type semiconductor layer 351 that are stacked in this order from the inter-layer insulating film 112 side toward the side of the light-emitting surfaces 351S1 and 351S2.

The configuration and/or function of the light-shielding layer 120 is similar to that of the other embodiments described above. In other words, the light-shielding layer 120 is located to be substantially parallel to the XY plane, and is provided to cover all of the circuit elements including the transistors 203-1 and 203-2. Therefore, the scattered light from the light-emitting layer 352 of the semiconductor layer 350 toward the light-shielding layer 120 is prevented from reaching the circuit elements by the light-shielding layer 120. When the light-shielding layer 120 is formed of a light-reflective material such as a metal, etc., the scattered light that reaches the light-shielding layer 120 can be reflected by the light-shielding layer 120 and oriented toward the light-emitting surface 251S side; therefore, the luminous efficiency of the semiconductor layer 350 can be increased.

The light-shielding layer 120 is insulated from the semiconductor layer 350 by the second insulating layer 112b. Therefore, the light-shielding layer 120 may be formed of a conductive material such as a metal, etc., can be connected to a fixed potential such as a ground line, a power supply line, etc., and can provide the effect of suppressing electromagnetic radiation due to the operation of the circuit elements.

The second inter-layer insulating film (the second insulating film) 356 covers the tops of the second insulating layer 112b and the semiconductor layer 350. The inter-layer insulating film 356 covers a portion of the semiconductor layer 350. It is favorable for the inter-layer insulating film 356 to cover the surface of an n-type semiconductor layer 551 other than the light-emitting surfaces (the exposed surfaces) 351S1 and 351S2 of the semiconductor layer 350. The inter-layer insulating film 356 covers the side surface of the semiconductor layer 350. It is favorable for the inter-layer insulating film 356 to be a white resin.

Openings 358-1 and 358-2 are formed in parts of the semiconductor layer 350 that are not covered with the inter-layer insulating film 356. The openings 358-1 and 358-2 are formed at positions that correspond to the light-emitting surfaces 351S1 and 351S2. The light-emitting surfaces 351S1 and 351S2 are formed at positions on the n-type semiconductor layer 351 that are separated from each other. The light-emitting surface 351S1 is located at the position on the n-type semiconductor layer 351 that is more proximate to the transistor 203-1. The light-emitting surface 351S2 is located at the position on the n-type semiconductor layer 351 that is more proximate to the transistor 203-2.

The openings 358-1 and 358-2 have, for example, square or rectangular shapes when projected onto the XY plane. The shapes are not limited to rectangular and may be circular, elliptical, or polygonal such as hexagonal, etc. The light-emitting surfaces 351S1 and 351S2 also are square, rectangular, another polygon, circular, etc., when projected onto the XY plane. The shapes of the light-emitting surfaces 351S1 and 351S2 may be similar to the shapes of the openings 358-1 and 358-2 or may be different shapes.

The second wiring layer 360 is located on the inter-layer insulating film 356. The wiring layer 360 includes a wiring portion 360k. The wiring portion 360k is located on the second inter-layer insulating film 356 that is located on the n-type semiconductor layer 351 between the openings 358-1 and 358-2. The wiring portion 360k is connected to a ground line that is not illustrated.

A transparent electrode 359k is located on the light-emitting surfaces 351S1 and 351S2 of the n-type semiconductor layer 351 exposed in the openings 358-1 and 358-2. The transparent electrode 359k is located on the wiring portion 360k. The transparent electrode 359k is located between the light-emitting surface 351S1 and the wiring portion 360k and between the light-emitting surface 351S2 and the wiring portion 360k. The transparent electrode 359k electrically connects the wiring portion 360k and the light-emitting surfaces 351S1 and 351S2.

As described above, the transparent electrode 359k is connected to the light-emitting surfaces 351S1 and 351S2 that are exposed in the openings 358-1 and 358-2. Therefore, the electrons that are supplied from the transparent electrode 359k are supplied to the n-type semiconductor layer 351 from the exposed light-emitting surfaces 351S1 and 351S2. On the other hand, holes are supplied to the p-type semiconductor layer 353 via the wiring portion 310d1, the via 361d1, a wiring portion 360a1, and a via 361a1 or via the wiring portion 310d2, the via 361d2, a wiring portion 360a2, and a via 361a2.

The transistors 203-1 and 203-2 are drive transistors of adjacent subpixels, and are sequentially driven. Accordingly, holes that are supplied from one of the two transistors 203-1 and 203-2 are injected into the light-emitting layer 352; electrons that are supplied from the wiring portion 360k are injected into the light-emitting layer 352, and the light-emitting layer 352 emits light.

The opening 358-1 and the light-emitting surface 351S1 are located at the position of the n-type semiconductor layer 351 that is more proximate to the transistor 203-1. Therefore, when the transistor 203-1 is switched on, the holes are injected via the wiring portion 310d1, the via 361d1, the wiring portion 360a1, and the via 361a1, and the light-emitting surface 351S1 emits light.

On the other hand, the opening 358-2 and the light-emitting surface 351S2 are located at the position of the n-type semiconductor layer 351 that is more proximate to the transistor 203-2. Therefore, when the transistor 203-2 is switched on, the holes are injected via the wiring portion 310d2, the via 361d2, the wiring portion 360a2, and the via 361a2, and the light-emitting surface 351S2 emits light.

A method for manufacturing the image display device of the embodiment will now be described.

FIGS. 17A to 18B are schematic cross-sectional views illustrating the method for manufacturing the image display device of the embodiment.

Figure 17A:
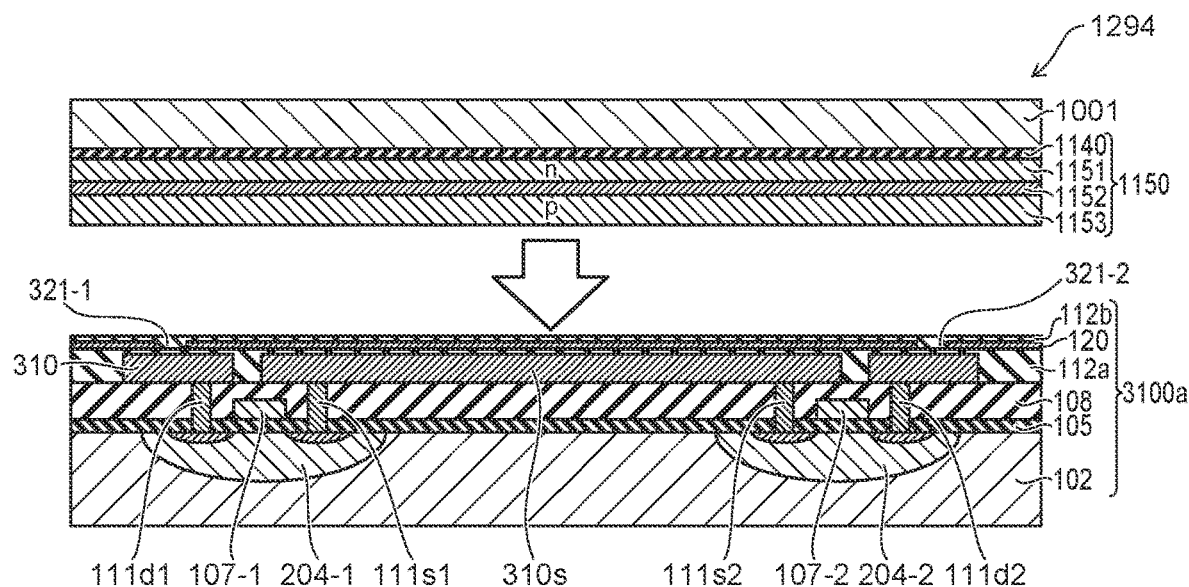
FIG. 17A is a schematic cross-sectional view illustrating a method for manufacturing the image display device of the third embodiment.

As shown in FIG. 17A, the semiconductor growth substrate 1294 and a circuit board 3100a are prepared and bonded to each other.

The semiconductor growth substrate 1294 includes the crystal growth substrate 1001 on which the semiconductor layer 1150 is epitaxially grown. In the semiconductor growth substrate 1294, the n-type semiconductor layer 1151, the light-emitting layer 1152, and the p-type semiconductor layer 1153 are stacked on the crystal growth substrate 1001 in this order from the crystal growth substrate 1001 side with the buffer layer 1140 interposed.

In the circuit board 3100a, the light-shielding layer 120 and the second insulating layer 112b are formed on the circuit board 1100 as described above with reference to FIGS. 5A to 5D. Although the configuration of the circuit of the circuit board 3100a is different from that of the other embodiments described above, almost all of the other parts are similar to the structures that are already described. Hereinbelow, only the reference numerals are replaced, and a detailed description is omitted as appropriate.

Figure 17B:
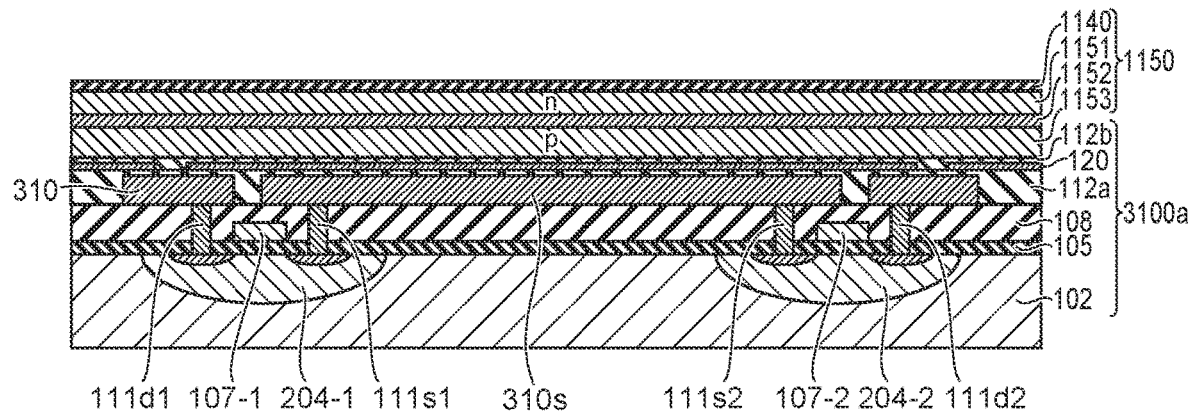
FIG. 17B is a schematic cross-sectional view illustrating the method for manufacturing the image display device of the third embodiment.

As shown in FIG. 17B, the crystal growth substrate 1001 is removed after the surface of the p-type semiconductor layer 1153 of the semiconductor layer 1150 is bonded to the surface of the second insulating layer 112b of the circuit board 3100a.

Figure 18A:
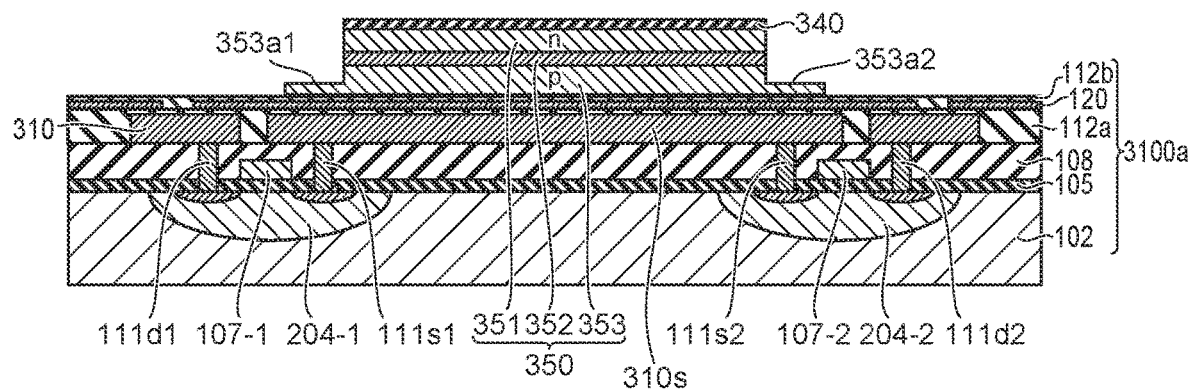
FIG. 18A is a schematic cross-sectional view illustrating the method for manufacturing the image display device of the third embodiment.

As shown in FIG. 18A, the semiconductor layer 350 is formed by etching the semiconductor layer 1150. A buffer layer 340 may be removed after the etching of the semiconductor layer 1150, or may be removed before the etching of the semiconductor layer 1150.

Figure 18B:
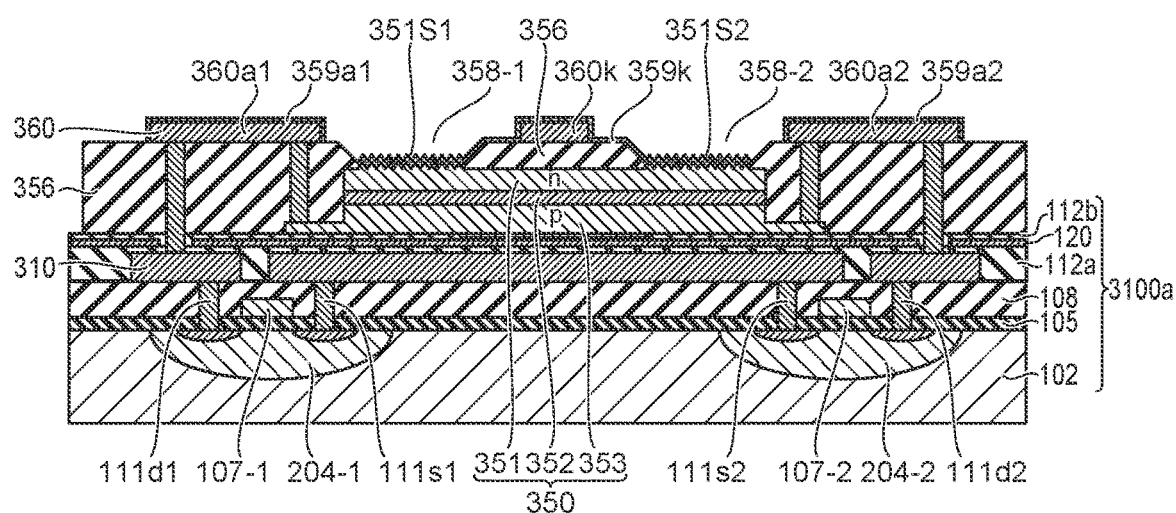
FIG. 18B is a schematic cross-sectional view illustrating the method for manufacturing the image display device of the third embodiment.

As shown in FIG. 18B, the inter-layer insulating film 356 is formed to cover the second insulating layer 112b and the semiconductor layer 350. Subsequently, the wiring layer 360 is formed on the inter-layer insulating film 356, and the wiring portions 360a1, 360a2, 360k, etc., are formed by etching.

The openings 358-1 and 358-2 are formed by removing the inter-layer insulating film 356 respectively at positions that correspond to the light-emitting surfaces 351S1 and 351S2.

The light-emitting surfaces 351S1 and 351S2 that are exposed by the openings 358-1 and 358-2 each are roughened. Subsequently, transparent electrodes 359a1, 359a2, and 359k are formed to electrically connect the wiring portion 360k and the light-emitting surfaces 351S1 and 351S2.

Thus, the subpixel group 320 that includes the semiconductor layer 350 that shares the two light-emitting surfaces 351S1 and 351S2 is formed.

Although two light-emitting surfaces 351S1 and 351S2 are provided in one semiconductor layer 350 according to the example, the number of light-emitting surfaces is not limited to two; it is also possible to provide three or more light-emitting surfaces in one semiconductor layer 350. As an example, one column or two columns of subpixels may be realized using a single semiconductor layer 350. As described below, the recombination current that does not contribute to the light emission per light-emitting surface can be reduced thereby, and the effect of realizing a finer light-emitting element can be increased.

(Modification)

Figure 19:
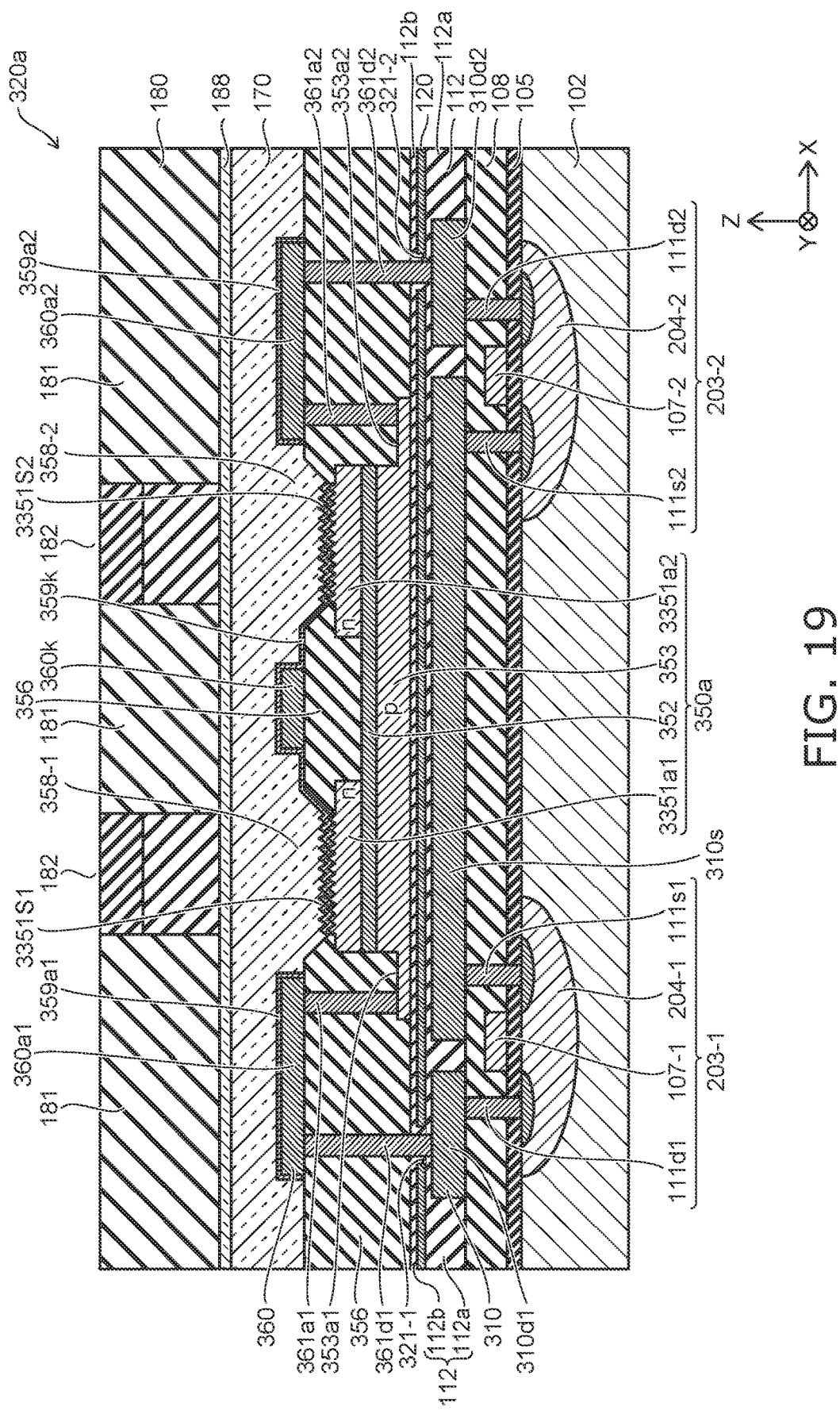
FIG. 19 is a schematic cross-sectional view illustrating a portion of an image display device according to a modification of the third embodiment.

FIG. 19 is a schematic cross-sectional view illustrating a portion of an image display device according to a modification of the embodiment.

The modification differs from the third embodiment described above in that two n-type semiconductor layers 3351a1 and 3351a2 are located on the light-emitting layer 352. Otherwise, the modification is the same as the third embodiment; the same components are marked with the same reference numerals, and a detailed description is omitted as appropriate.

As shown in FIG. 19, the image display device of the modification includes a subpixel group 320a. The subpixel group 320a includes a semiconductor layer 350a. The semiconductor layer 350a includes the p-type semiconductor layer 353, the light-emitting layer 352, and the n-type semiconductor layers 3351a1 and 3351a2. The p-type semiconductor layer 353, the light-emitting layer 352, and the n-type semiconductor layers 3351a1 and 3351a2 are stacked in this order from the inter-layer insulating film 356 toward the side of light-emitting surfaces 3351S1 and 3351S2.

The n-type semiconductor layers 3351a1 and 3351a2 are arranged to be separated along the X-axis direction on the light-emitting layer 352. The inter-layer insulating film 356 is located between the n-type semiconductor layers 3351a1 and 3351a2, and the n-type semiconductor layers 3351a1 and 3351a2 is divided by the inter-layer insulating film 356.

The n-type semiconductor layers 3351a1 and 3351a2 have substantially the same shape when projected onto the XY plane; the shape is a substantially square or rectangular shape, and may be another polygonal shape, circular, etc.

The n-type semiconductor layers 3351a1 and 3351a2 respectively include the light-emitting surfaces 3351S1 and 3351S2. The light-emitting surfaces 3351S1 and 3351S2 are surfaces of the n-type semiconductor layers 3351a1 and 3351a2 that are exposed respectively by the openings 358-1 and 358-2.

Similarly to the shape of the light-emitting surface of the third embodiment, the shapes of the light-emitting surfaces 3351S1 and 3351S2 when projected onto the XY plane are substantially the same shape, and are a shape that is substantially square, etc. The shapes of the light-emitting surfaces 3351S1 and 3351S2 are not limited to rectangular such as that of the embodiment, and may be circular, elliptical, or polygonal such as hexagonal, etc. The shapes of the light-emitting surfaces 3351S1 and 3351S2 may be similar to the shapes of the openings 358-1 and 358-2, or may be different shapes.

The transparent electrode 359k is located on each of the light-emitting surfaces 3351S1 and 3351S2. The transparent electrode 359k is located also on the wiring portion 360k. The transparent electrode 359k is located between the wiring portion 360k and the light-emitting surface 3351S1 and between the wiring portion 360k and the light-emitting surface 3351S2. The transparent electrode 359k electrically connects the wiring portion 360k and the light-emitting surfaces 3351S1 and 3351S2.

Figure 20A:
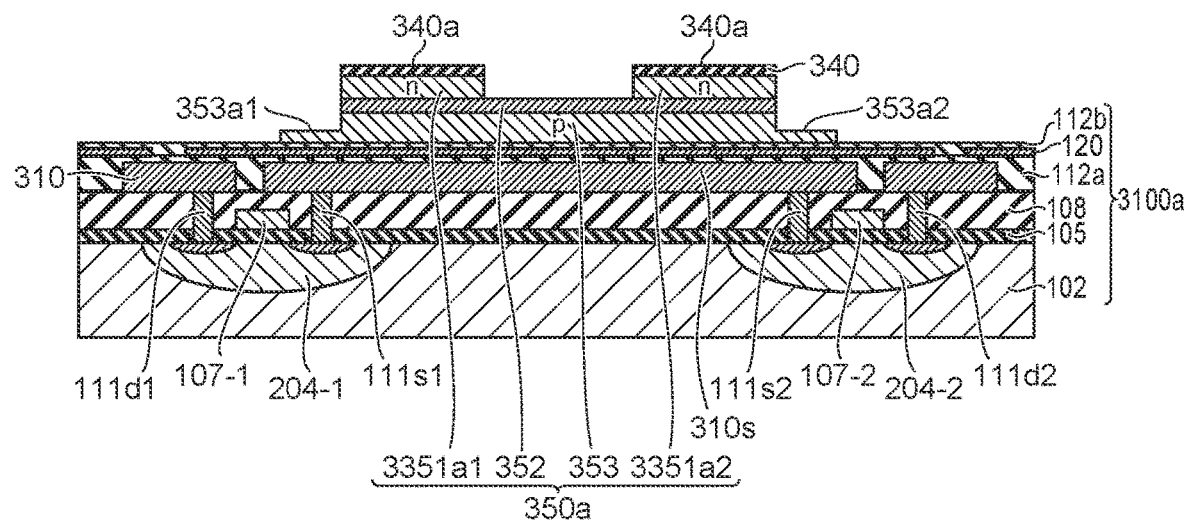
FIG. 20A is a schematic cross-sectional view illustrating a method for manufacturing the image display device of the modification of the third embodiment.
Figure 20B:
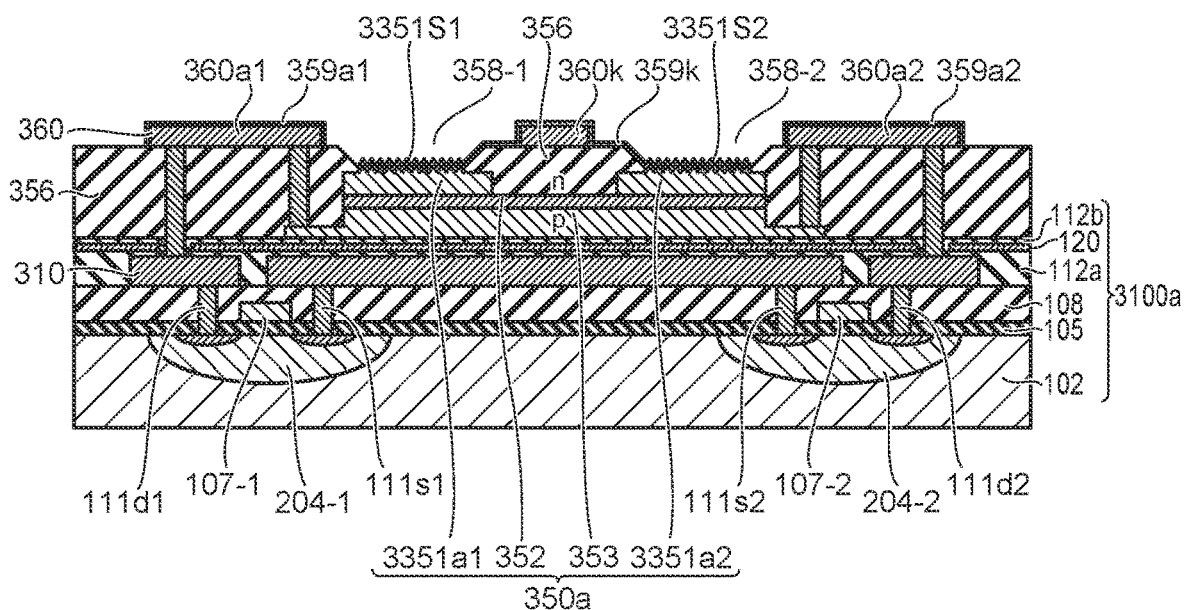
FIG. 20B is a schematic cross-sectional view illustrating the method for manufacturing the image display device of the modification of the third embodiment.

FIGS. 20A and 20B are schematic cross-sectional views illustrating a method for manufacturing the image display device of the modification.

Processes similar to the processes described in reference to FIGS. 16A and 16B of the third embodiment are applied to the modification up to the bonding of the circuit board 3100a to the semiconductor layer 1150. The subsequent processes will now be described.

According to the modification as shown in FIG. 20A, the light-emitting layer 352 and the p-type semiconductor layer 353 are formed by etching the p-type semiconductor layer 1153, the light-emitting layer 1152, and the n-type semiconductor layer 1151 of FIG. 17B; subsequently, the two n-type semiconductor layers 3351a1 and 3351a2 are formed by further etching. A buffer layer 340a may be removed subsequently, or the buffer layer may be removed before etching the n-type semiconductor layer 1151.

The n-type semiconductor layers 3351a1 and 3351a2 may be formed by performing even deeper etching. For example, etching for forming the n-type semiconductor layers 3351a1 and 3351a2 may be performed to a depth that reaches the interior of the light-emitting layer 352 and the interior of the p-type semiconductor layer 353. Thus, when deeply etching the n-type semiconductor layer, it is desirable for the etching position of the n-type semiconductor layer 1151 to be separated from the outer perimeters of the light-emitting surfaces 3351S1 and 3351S2 of the n-type semiconductor layer described below by not less than 1 μm. The recombination current can be suppressed by setting the etching position to be separated from the outer perimeters of the light-emitting surfaces 3351S1 and 3351S2.

As shown in FIG. 20B, the inter-layer insulating film 356 that covers the second insulating layer 112b and the semiconductor layer 350a is formed. The wiring layer 360 is formed on the inter-layer insulating film 356, and the wiring portions 360a1, 360a2, 360k, etc., are formed by etching.

The openings 358-1 and 358-2 are formed in the inter-layer insulating film at positions that correspond respectively to the light-emitting surfaces 3351S1 and 3351S2. The light-emitting surfaces 3351S1 and 3351S2 of the n-type semiconductor layer that are exposed by the openings 358-1 and 358-2 each are roughened. Subsequently, transparent electrodes 359a and 359k are formed.

Thus, the subpixel group 320a that includes the two light-emitting surfaces 3351S1 and 3351S2 is formed.

According to the modification as well, similarly to the third embodiment, the number of light-emitting surfaces is not limited to two; three or more light-emitting surfaces may be provided in one semiconductor layer 350a.

Effects of the image display device of the embodiment will now be described.

Figure 21:
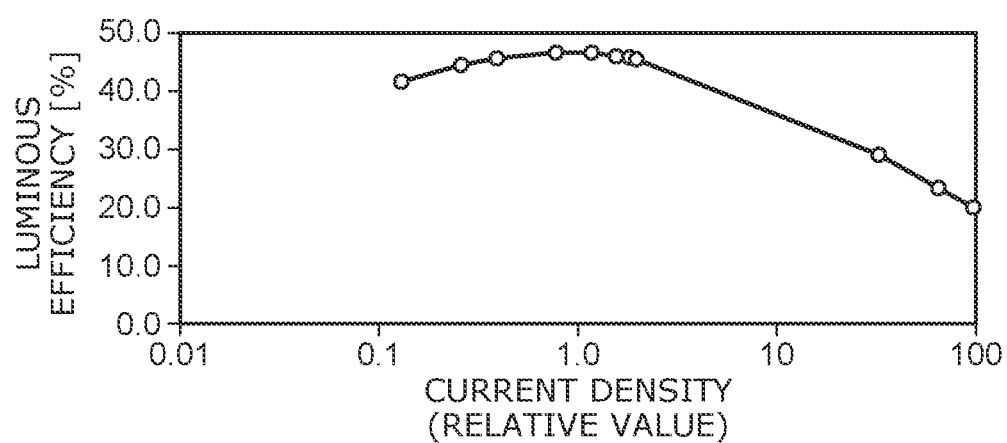
FIG. 21 is a graph illustrating a characteristic of a pixel LED element.

FIG. 21 is a graph illustrating a characteristic of a pixel LED element.

The vertical axis of FIG. 21 illustrates the luminous efficiency (%). The horizontal axis illustrates the current density of the current caused to flow in the pixel LED element as a relative value.

As shown in FIG. 21, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency is a maximum exists in the pixel LED element.

It may be expected that a highly efficient image display device is realized by suppressing the current density so that a sufficient luminance is obtained from the light-emitting element. However, it is shown by FIG. 21 that there is a tendency for the current density to decrease and for the luminous efficiency to decrease for a low current density.

As described in the first embodiment and the second embodiment, the light-emitting element is formed by individually singulating by etching or the like of all of the layers of the semiconductor layer 1150 that includes the light-emitting layer. At this time, the junction surface between the light-emitting layer and the n-type semiconductor layer is exposed at the end portion. Similarly, the junction surface between the light-emitting layer and the p-type semiconductor layer is exposed at the end portion.

When such an end portion exists, electrons and holes recombine at the end portion. On the other hand, such recombination does not contribute to the light emission. The recombination at the end portion occurs substantially regardless of the current caused to flow in the light-emitting element. It is considered that the recombination occurs according to the length of the junction surface that contributes to the light emission of the end portion.

When two light-emitting elements that have cubic shapes of the same dimensions emit light, end portions are formed at four sides for each light-emitting element; therefore, recombination may occur at a total of eight end portions.

Conversely, according to the embodiment, there are four end portions in the semiconductor layers 350 and 350a that include two light-emitting surfaces. The region between the openings 358-1 and 358-2 substantially does not contribute to the light emission because few electrons and holes are injected into this region; therefore, the end portions that contribute to the light emission can be considered to be six. Thus, according to the embodiment, by substantially reducing the number of end portions, the recombination that does not contribute to the light emission can be reduced, and the drive current can be reduced commensurately.

When shortening the distance between the subpixels for higher definition or the like, when the current density is relatively high, etc., the distance between the light-emitting surfaces 351S1 and 351S2 becomes short in the subpixel group 320 of the third embodiment. In such a case, when the n-type semiconductor layer 351 is shared, there is a risk that a portion of the electrons injected into the adjacent light-emitting surface side may shunt, and the light-emitting surface at the side that is not driven may have a micro light emission. According to the modification, the n-type semiconductor layer is divided for each light-emitting surface; therefore, the occurrence of a micro light emission at the light-emitting surface at the side that is not driven can be reduced.

According to the embodiment, the semiconductor layer that includes the light-emitting layer includes the p-type semiconductor layer, the light-emitting layer, and the n-type semiconductor layer that are stacked in this order from the inter-layer insulating film side, and is favorable from the perspective of increasing the luminous efficiency by roughening the exposed surface of the n-type semiconductor layer. Similarly to the first embodiment, the n-type semiconductor layer, the light-emitting layer, and the p-type semiconductor layer may be stacked in this order by replacing the stacking order of the p-type semiconductor layer and the n-type semiconductor layer.

Fourth Embodiment

The image display device described above can be used as an image display module having the appropriate number of pixels in, for example, a computer display, a television, a portable terminal such as a smartphone, car navigation, etc.

Figure 22:
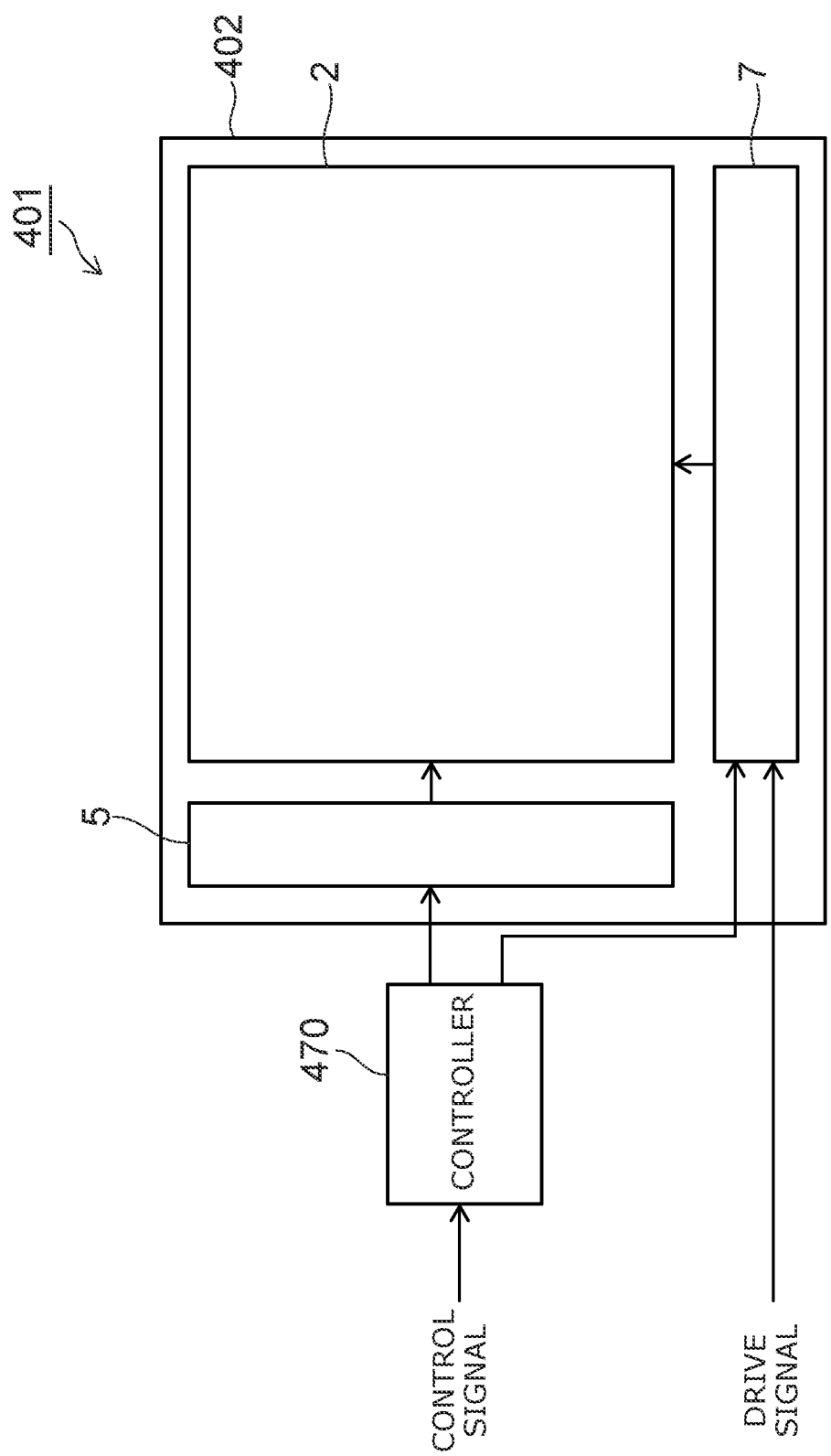
FIG. 22 is a block diagram illustrating an image display device according to a fourth embodiment.

FIG. 22 is a block diagram illustrating the image display device according to the embodiment.

Main parts of the configuration of a computer display are shown in FIG. 22.

As shown in FIG. 22, the image display device 401 includes an image display module 402. The image display module 402 is, for example, an image display device that includes the configuration of the first embodiment described above. The image display module 402 includes the display region 2 in which the subpixels 20 are arranged, the row selection circuit 5, and the signal voltage output circuit 7.

The image display device 401 further includes a controller 470. The controller 470 receives input of control signals that are separated and generated by not-illustrated interface circuitry, and controls the driving and the drive sequence of the subpixels in the row selection circuit 5 and the signal voltage output circuit 7.

(Modification)

Figure 23:
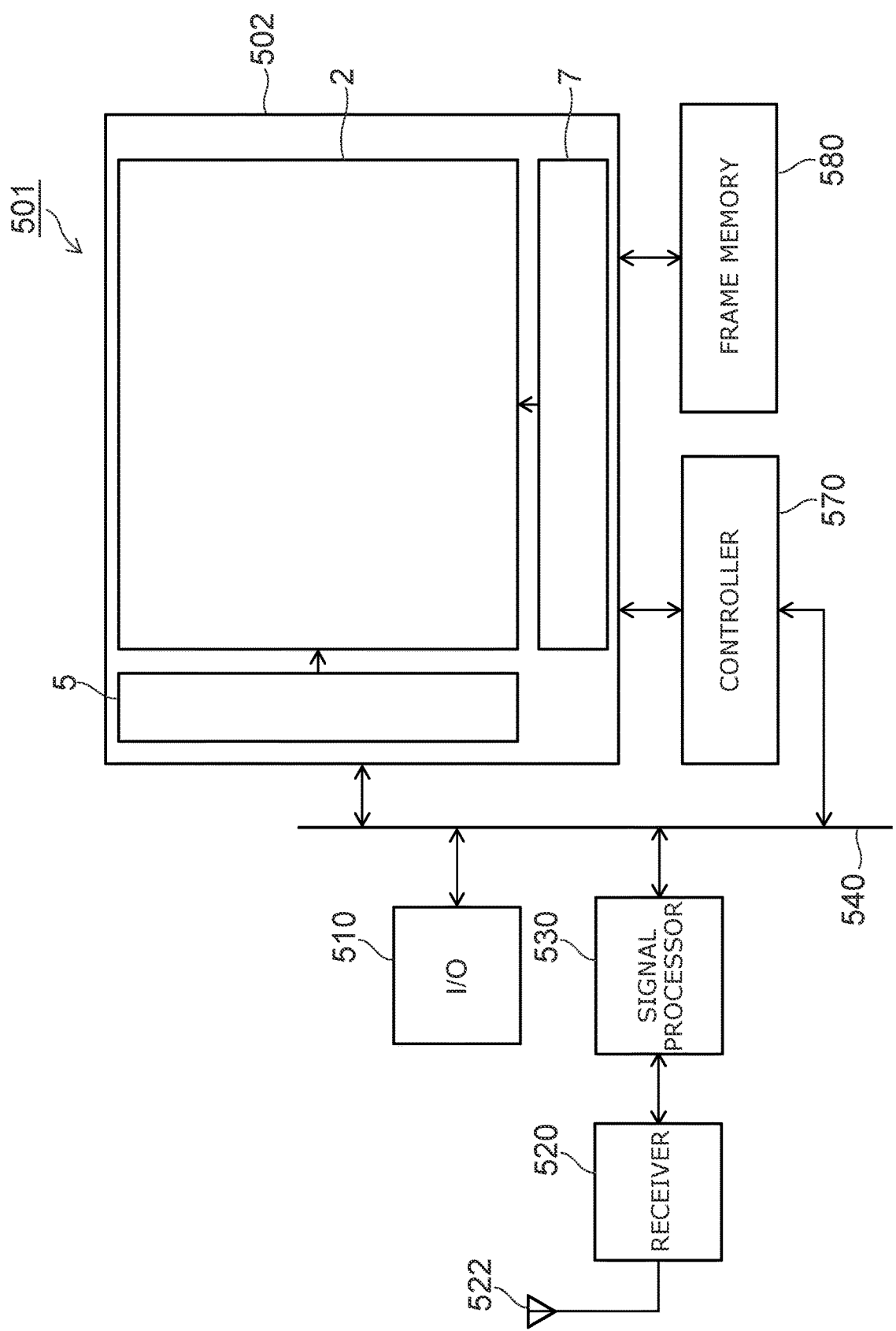
FIG. 23 is a block diagram illustrating an image display device according to a modification of the fourth embodiment.

FIG. 23 is a block diagram illustrating an image display device of the modification.

The configuration of a high-definition thin television is shown in FIG. 23.

As shown in FIG. 23, the image display device 501 includes an image display module 502. The image display module 502 is, for example, the image display device 1 that includes the configuration of the first embodiment described above. The image display device 501 includes a controller 570 and a frame memory 580. Based on a control signal supplied by a bus 540, the controller 570 controls the drive sequence of the subpixels of the display region 2. The frame memory 580 stores one frame of display data and is used for smooth processing such as video image reproduction, etc.

The image display device 501 includes an I/O circuit 510. The I/O circuit 510 provides interface circuitry and the like for connecting with external terminals, devices, etc. The I/O circuit 510 includes, for example, a USB interface that connects an external hard disk device or the like, an audio interface, etc.

The image display device 501 includes a receiver 520 and a signal processor 530. An antenna 522 is connected to the receiver 520, and the necessary signal is separated and generated from the radio wave received by the antenna 522. The signal processor 530 includes a DSP (Digital Signal Processor), a CPU (Central Processing Unit), etc., and the signal that is separated and generated by the receiver 520 is separated and generated into image data, audio data, etc., by the signal processor 530.

Other image display devices also can be made by using the receiver 520 and the signal processor 530 as a high frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module of the embodiment is not limited to the configuration of the image display device of the first embodiment; modifications of the first embodiment or of other embodiments may be used.

Figure 24:
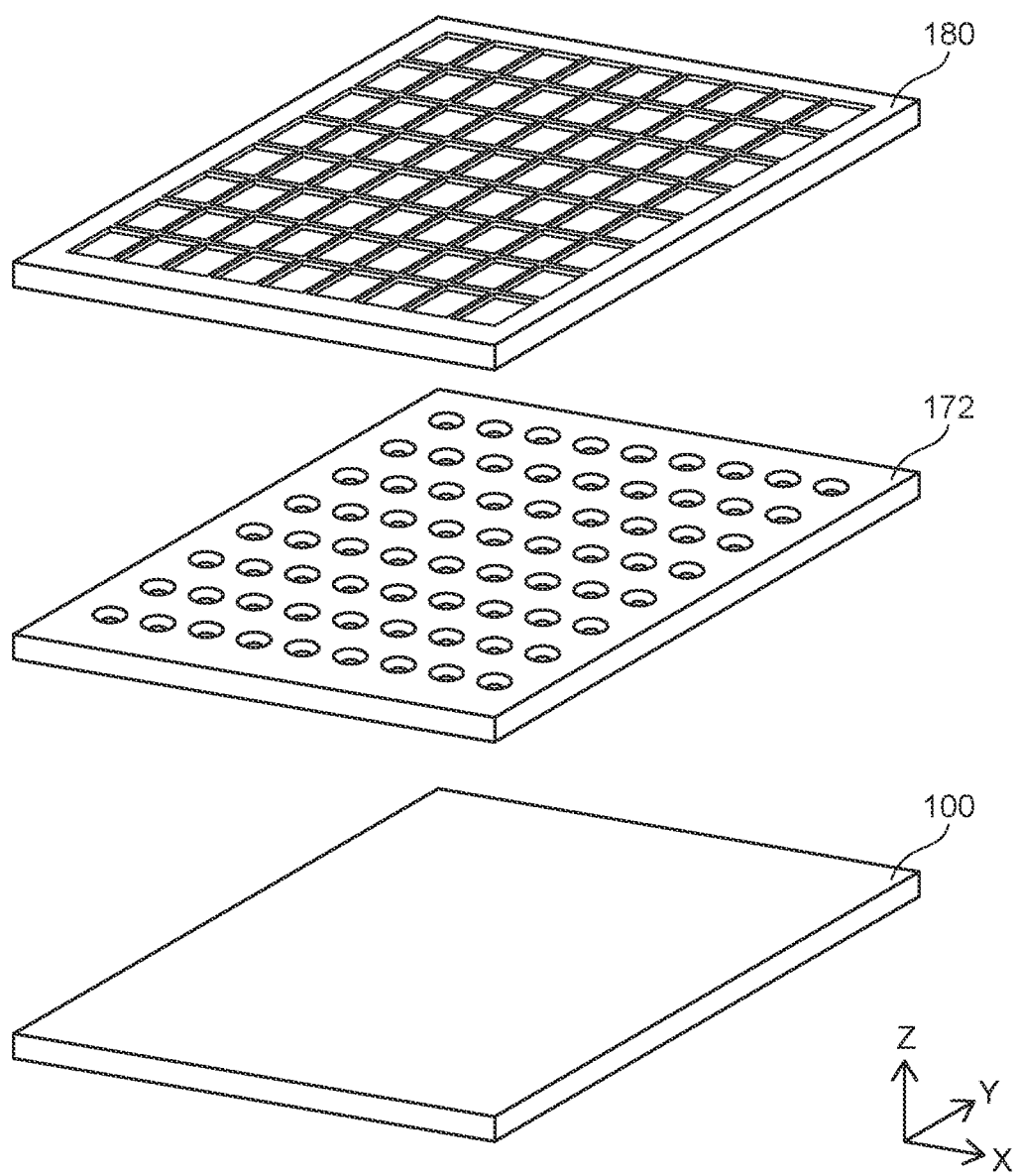
FIG. 24 is a perspective view schematically illustrating the image display device of the first to third embodiments and modifications of the first to third embodiments.

FIG. 24 is a perspective view schematically illustrating the image display device of the first to third embodiments and modifications of the first to third embodiments.

As shown in FIG. 24, in the image display device of the first to third embodiments, the light-emitting circuit part 172 that includes many subpixels on the circuit board 100 is located as described above. The color filter 180 is located on the light-emitting circuit part 172. According to the sixth embodiment, the structural component that includes the circuit board 100, the light-emitting circuit part 172, and the color filter 180 is used as the image display modules 402 and 502 and is embedded in the image display devices 401 and 501.

According to embodiments described above, an image display device and a method for manufacturing an image display device can be realized in which the transfer process of the light-emitting elements is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are included in the scope and spirit of the inventions, and are included in the scope of the inventions described in the claims and their equivalents. Also, embodiments described above can be implemented in combination with each other.

REFERENCE NUMERAL LIST 1, 201, 401, 501 image display device
2 display region
3 power supply line
4 ground line
5, 205 row selection circuit
6, 206 scanning line
7, 207 signal voltage output circuit
8 signal line
10 pixel
20, 20a, 20b, 20c subpixel
22, 222 light-emitting element
24, 224 select transistor
26, 226 drive transistor
28, 228 capacitor
100 circuit board
101 circuit
103, 103-1, 103-2 transistor
104, 104-1, 104-2 element formation region
105 insulating layer
107, 107-1, 107-2 gate
108 insulating film
110, 210, 310 first wiring layer
112 first insulating film
112a first insulating layer
112b second insulating layer
120 light-shielding layer
121, 321-1, 321-2 through-hole
150, 250 light-emitting element
156, 256, 356 second insulating film
160, 260, 360 second wiring layer
161d, 161k, 261a, 361a1, 361a2, 361d1, 361d2 via
180 color filter
320, 320a subpixel group
470, 570 controller
1001 crystal growth substrate
1100, 1100a, 3100a circuit board
1140 buffer layer
1150 semiconductor layer
1190 support substrate
1192 structure body
1194, 1294 semiconductor growth substrate

The invention claimed is:

1. A method for manufacturing an image display device, the method comprising:

providing a semiconductor growth substrate comprising a semiconductor layer on a first substrate, the semiconductor layer comprising a light-emitting layer;

providing a second substrate comprising a circuit and a first wiring layer, wherein the circuit comprises a circuit element, and the first wiring layer is electrically connected to the circuit element;

forming a light-shielding layer on the second substrate;

forming an insulating film on the light-shielding layer;

bonding the semiconductor layer to the second substrate on which the insulating film is formed;

forming a light-emitting element by etching the semiconductor layer;

forming an insulating layer that covers the light-emitting element; and electrically connecting the light-emitting element to the circuit element, wherein:

the light-shielding layer is located between the light-emitting element and the first wiring layer, and in a plan view, the light-shielding layer covers the circuit element.

2. The method for manufacturing the image display device according to claim 1, further comprising:

before the step of bonding the semiconductor layer to the second substrate, removing the first substrate.

3. The method for manufacturing the image display device according to claim 1, further comprising:

after the step of bonding the semiconductor layer to the second substrate, removing the first substrate.

4. The method for manufacturing the image display device according to claim 1, wherein:

the semiconductor layer comprises an n-type semiconductor layer, the light-emitting layer, and a p-type semiconductor layer, stacked in this order from a first substrate side.

5. The method for manufacturing the image display device according to claim 1, wherein:

the step of electrically connecting the light-emitting element to the circuit element comprises forming a via that extends through the insulating layer, the insulating film, and the light-shielding layer.

6. The method for manufacturing the image display device according to claim 1, further comprising:

exposing a surface of the light-emitting element from under the insulating layer.

7. The method for manufacturing the image display device according to claim 6, further comprising:

forming a transparent electrode at an exposed surface of the exposed light- emitting element.

8. The method for manufacturing the image display device according to claim 1, wherein:

the first substrate comprises silicon or sapphire.

9. The method for manufacturing the image display device according to claim 1, wherein:

the semiconductor layer comprises a gallium nitride compound semiconductor, and the second substrate comprises silicon.

10. The method for manufacturing the image display device according to claim 1, further comprising:

forming a wavelength conversion member on the light-emitting element.

* * * * *